(12) United States Patent
Hsieh et al.

(10) Patent No.: US 8,093,087 B2
(45) Date of Patent: Jan. 10, 2012

(54) METHOD FOR FABRICATING MEMS DEVICE

(75) Inventors: Tsung-Min Hsieh, Taipei County (TW); Chien-Hsing Lee, Hsinchu County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 13/209,461

(22) Filed: Aug. 15, 2011

(65) Prior Publication Data
US 2011/0300659 A1 Dec. 8, 2011

Related U.S. Application Data

(62) Division of application No. 12/691,754, filed on Jan. 22, 2010, now Pat. No. 8,030,112.

(51) Int. Cl.
*H01L 21/00* (2006.01)
(52) U.S. Cl. ........ 438/51; 438/50; 438/52; 257/E21.499
(58) Field of Classification Search .................... 438/50, 438/51, 52
See application file for complete search history.

(56) References Cited

U.S. PATENT DOCUMENTS

| 7,615,395 B2* | 11/2009 | Heuvelman | 438/52 |
| 7,998,776 B1* | 8/2011 | Li et al. | 438/53 |
| 8,030,112 B2* | 10/2011 | Hsieh et al. | 438/51 |
| 2004/0207074 A1* | 10/2004 | MacDonald et al. | 257/708 |
| 2008/0185668 A1* | 8/2008 | Kim et al. | 257/415 |
| 2011/0027929 A1* | 2/2011 | Shih | 438/50 |
| 2011/0089503 A1* | 4/2011 | Fujita et al. | 257/415 |

* cited by examiner

*Primary Examiner* — Alexander Ghyka
(74) *Attorney, Agent, or Firm* — Jianq Chyun IP Office

(57) ABSTRACT

Method for fabricating MEMS device has a first surface and a second surface and having a MEMS region and an IC region. A MEMS structure is formed over the first surface. A structural dielectric layer is formed over the first surface. The structural dielectric layer has a dielectric member and the spaces surrounding the MEMS structure is filled with the dielectric member. The substrate is patterned by etching process from the second surface of the substrate to expose a portion of the dielectric member filled in the space surrounding the MEMS structure. A wettable thin layer is formed to cover an exposed portion of the substrate at the second surface. An etching process is performed on the dielectric member filled in the spaces surrounding the MEMS structure. The MEMS structure is exposed and released by the etching process. The etching process comprises an isotropic etching process with a wet etchant.

5 Claims, 35 Drawing Sheets

METHOD FOR FABRICATING MEMS DEVICE

CROSS-REFERENCE TO RELATED APPLICATION

This application is a divisional application of and claims the priority benefit of U.S. application Ser. No. 12/691,754, filed on Jan. 22, 2010, now allowed. The above-mentioned patent application is hereby incorporated by reference herein and made a part of this specification.

BACKGROUND OF THE INVENTION

1. Field of Invention

The present invention relates to microelectromechanical system (MEMS) device. More particularly, the present invention relates to a method for fabricating CMOS MEMS device having single crystal structure (SCS) for the MEMS structure.

2. Description of Related Art

MEMS device has been proposed in various applications. However, the MEMS device usually is staying in an open environment. Since the MEMS structure of the MEMS device is sensitive to the environmental air, the operation in open environment may pick up noise. A hermetic MEMS device is then proposed.

A hermetic MEMS package has properties including isolating the MEMS from the outside environment. For example, the damping of air and thermal noise can be avoided by forming a vacuum environment for MEMS. In addition, hermetic camber can protects the MEMS device from EM interference and produce a small size MEMS device with high performance and low cost for popularity. The applications for the hermetic MEMS packages include accelerometer, gyroscope, resonator, or RF MEMS components.

For the current hermetic MEMS products, the MEMS and sensing element are manufactured in separate substrate. FIG. 1A is a cross-sectional view, illustrating conventional hermetic MEMS device. In FIG. 1A, the conventional hermetic MEMS device includes a lower substrate 100, a middle substrate 102 and a top substrate 104. The lower substrate 100 is patterned to have an indent space 106 and a CMOS circuit with the connection pad 114 as the sensing IC. The middle substrate 102 is fabricated into a MEMS structure with the venting holes 110. The top substrate 104 is fabricated like a cap with the indent space 108. The middle substrate 102 is adhered with the bottom substrate 100 and the top substrate 104 by the adhering rings 112. As a result, the indent spaces 106 and 108 with the venting holes 110 form a hermetic chamber.

However, this conventional process has some drawbacks, including high cost, production yield issue due to three elements being packaged into a device, and parasitic effect for the conjunction of MEMS and sensing IC.

In addition to the hermetic chamber for MEMS device, the mechanical quality in MEMS structure is also important. For the current process with MEMS in integrated circuit (IC) substrate, the MEMS structure is usually formed by the metal layer and dielectric layer used in the interconnection of integrated circuits. However, the mechanical quality is unstable using the interconnection layers of CMOS as MEMS structures. For example, the residue stress may be different significantly within a single wafer or wafer by wafer.

FIG. 1B is a cross-sectional view, illustrating another conventional hermetic MEMS device. In FIG. 1B, there are several device structures formed on the substrate 120, including the MEMS structure 132 and the CMOS circuit 134. In this structure, several metal layers 124-128 are embedded in the dielectric layer 122 to serving as the interconnect while the MEMS structure 132 with polysilicon structure 130 are also formed in the dielectric layer 122. In other words, the MEMS structure 132 is formed in the same process for the interconnect layer of the CMOS circuit 134, usually, the residue stress may be different within a single wafer or wafer by wafer. This cause the mechanical quality being unstable.

When fabricating CMOS MEMS device having the single crystal structure, the fabrication needs to be further concerned and developed.

SUMMARY OF THE INVENTION

The invention provides a method for fabricating a MEMS device. The MEMS device can be based on a single crystal structure (SCS).

In an aspect of the invention, a method for fabricating MEMS device includes providing a substrate, having a first surface and a second surface and having a MEMS region and an integrated-circuit (IC) region. Then, a plurality of SCS (single crystal structure) mass blocks are formed on the first surface of the substrate in the MEMS region. A structural dielectric layer is formed over the first surface of the substrate. The structural dielectric layer has a dielectric member. The spaces surrounding the SCS mass blocks in the MEMS region are filled with the dielectric member. The IC region has a circuit structure with the interconnection structure formed in the structural dielectric layer. An isotropic etching process is performed at least on the dielectric member filled in the spaces surrounding the mass blocks. Wherein, the mass blocks are exposed to release a MEMS structure.

In an aspect of the invention, a method for fabricating MEMS device, having a first surface and a second surface and having a MEMS region and an integrated-circuit (IC) region. Then a MEMS structure is formed over the first surface of the substrate. A structural dielectric layer is formed over the first surface of the substrate. The structural dielectric layer has a dielectric member and the spaces surrounding the MEMS structure is filled with the dielectric member. The substrate is patterned by an etching process from the second surface of the substrate to expose a portion of the dielectric member filled in the space surrounding the MEMS structure. A wettable thin layer is formed to cover an exposed portion of the substrate at the second surface. At least an etching process is performed on the dielectric member filled in the spaces surrounding the MEMS structure. The MEMS structure is exposed and released by the etching process, wherein the etching process comprises an isotropic etching process with a wet etchant and at least a portion of the dielectric member in the spaces surrounding the MEMS structure is removed by the said isotropic etching from the second side of the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
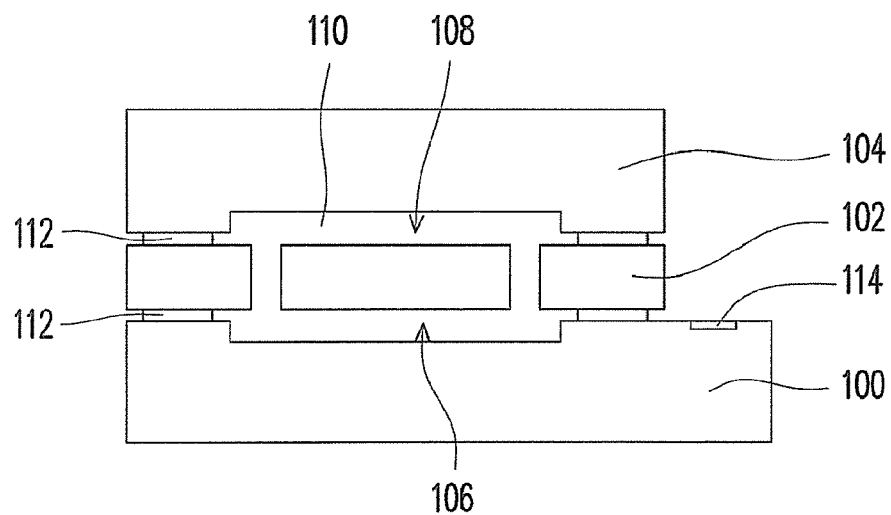
FIG. 1A-1B are cross-sectional views, illustrating some conventional hermetic MEMS device with SCS MEMS structure.
Figure 1B:
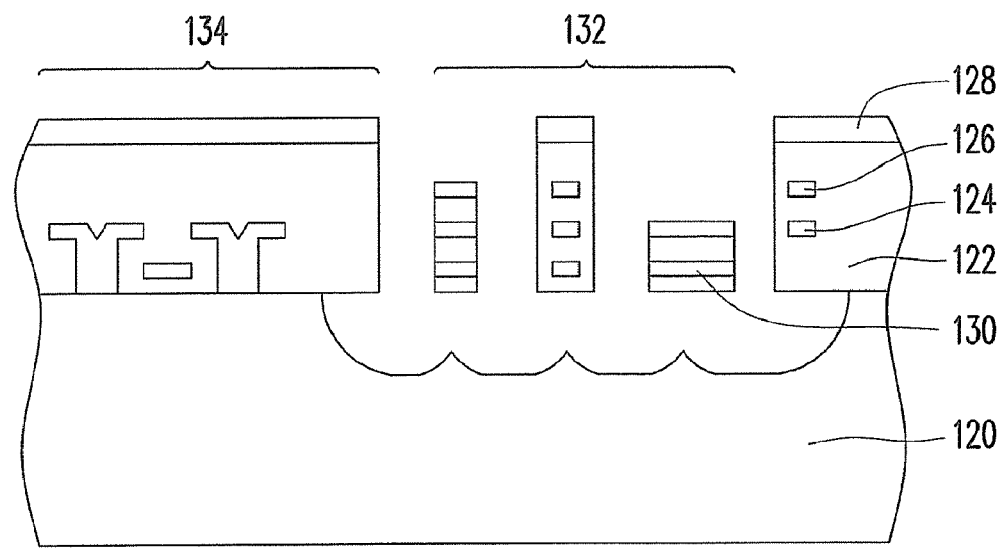

In the invention, several methods for fabricating MEMS device are proposed. The MEMS device is fabricated based on single crystal structure. Moreover, a MEMS having a hermetic chamber or a MEMS opening to the environment are also fabricated based on single crystal structure.

Generally, the fabrication of SCS (single crystal structure) is used in fabrication for CMOS (complementary metal-oxide-semiconductor) integrated circuit. However, the MEMS device can be formed by the manner of SCS. The invention proposes a fabrication method for the MEMS device. Also and, the MEMS device is easy to be formed with an embedded hermetic chamber, according to several embodiments. Basically, for example, the SCS of MEMS device can be suspended from silicon substrate on the front side of the substrate. Alternatively, the SCS of MEMS device can be suspended from silicon substrate on the back side of the substrate. In addition, the extra electrode may be able to form on the side wall of SCS to increase the capacitance for MEMS capacitance sensing.

The MEMS device fabricated in SCS can have stable mechanical quality. The silicon wafer is well controlled during manufacturing. In addition, the MEMS device with hermetic chamber can isolate the MEMS structure from the interference of outside environment. Even further, a vacuum environment within the hermetic chamber can be formed for the MEMS device to avoid the interference of air damping and thermal noise of air. The MEMS device with hermetic chamber can have various applications, such as accelerometers, gyroscopes, resonator, switched, RF MEMS components, . . . , and so on.

Besides, for some MEMS exposed to the environment to sense acoustic signal or air pressure, e.g. MEMS microphone or pressure sensor, such MEMS structure is have one moveable diaphragm and a rigid back plate to form a capacitor for capacitance sensing. The back plate of the capacitor can be fabricated in the process of SCS while the moveable diaphragm is formed by conductive and dielectric layers used in the interconnection of CMOS circuit.

The release of MEMS structure with SCS manner in CMOS IC can be done by including several processes. For example, isotropic etching with wet or vapor etchant (Vapor HF) can be used to remove the dielectric layer surrounding the SCS. The CMOS circuits on the front side of the substrate are protected by a protection layer. The sealing structural dielectric layer covering the MEMS can protect the CMOS circuits from damage during the release. An oxide layer is deposited on the exposed silicon surface to lead the wet etchant to pass by the silicon holes, channels or cavity and reach the dielectric layer, such as silicon oxide, before performing wet isotropic etching process to release the MEMS.

Further, the embedded hermetic chamber for MEMS device can be achieved by forming a cover on the bottom of the substrate to form a hermetic chamber. The exposure of metal pad can be before or after the formation of the hermetic chamber.

Several embodiments are provided for describing the invention. However, the invention is not limited to the provided embodiments and the provided embodiments can be properly combined to each other.

Figure 2A:
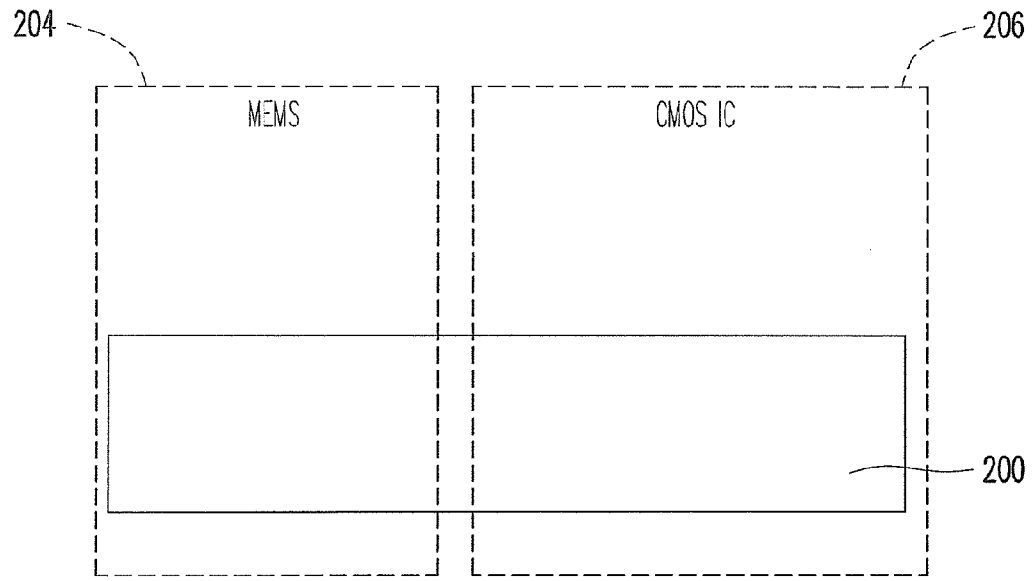
FIGS. 2A-2J are cross-sectional views, schematically illustrating the fabrication process for MEMS device with SCS MEMS structure, according to one of embodiments of the invention.
Figure 2B:
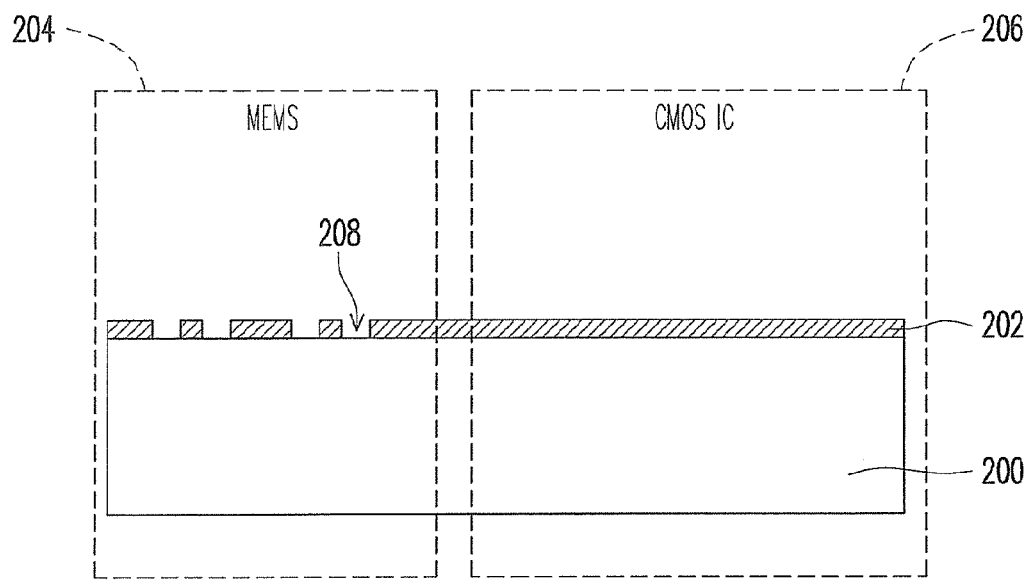

FIGS. 2A-2J are cross-sectional views, schematically illustrating the fabrication process for MEMS device, according to one of embodiments of the invention. In FIG. 2A, a substrate 200 is provided. The substrate 200 can be single crystal silicon substrate for the SCS fabrication. The substrate 200 has been configured to have a MEMS region 204 and an IC region 206. The MEMS region 204 is reserved for fabricating the MEMS device and the IC region 206 is reserved for fabricating the necessary IC, such as CMOS IC. After then, in FIG. 2B, a hard mask layer 202 is formed on the substrate 200. The hard mask layer 202 is, for example, silicon nitride, which is harder than silicon oxide. The hard mask layer 202 is patterned to form several opening patterns 208 in the MEMS region 204 to expose the substrate 200 by, for example, photolithographic process and etching process. The opening patterns 208 have the geometry shape in accordance with the MEMS structure formed later.

Figure 2C:
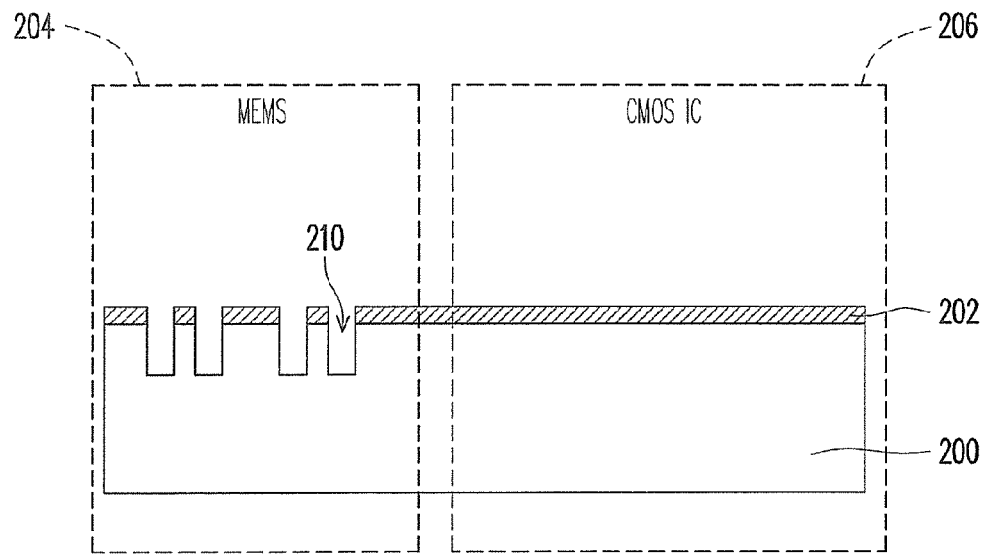

In FIG. 2C, the had mask layer 202 with the opening patterns 208 is used as an etching mask, then an anisotropic etching process can be performed on the substrate to form the trenches 210 with a predetermined depth. Some trenches may be arranged as a group. In this example, the two adjacent trenches are treated as a group.

Figure 2D:
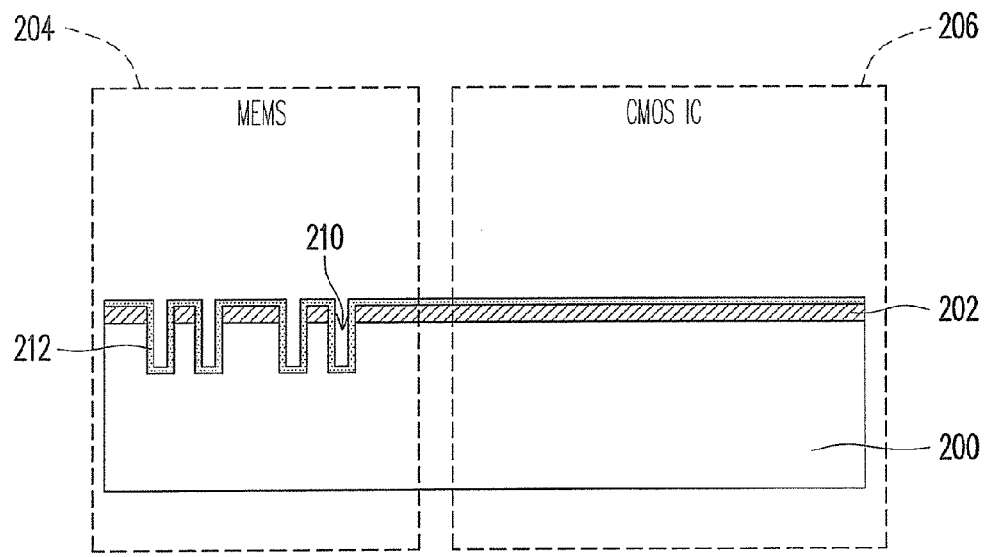

In FIG. 2D, a thin dielectric layer 212 is formed over the substrate being conformal to the structure existing over the substrate. The thin dielectric layer 212 also covers the sidewall of the trenches 210. The thin dielectric layer 212 can be, for example, silicon oxide.

Figure 2E:
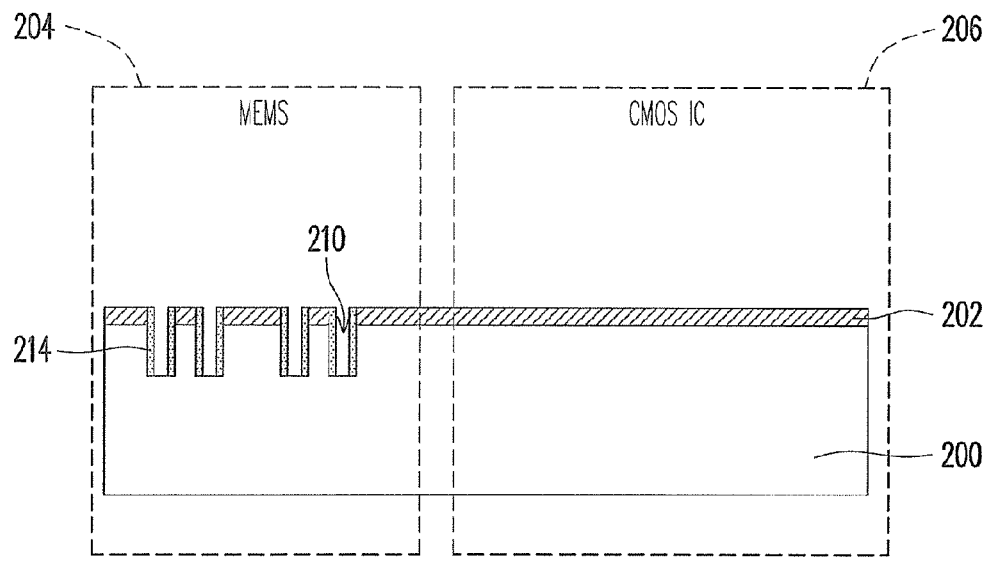

In FIG. 2E, an etching back process can be performed to remove the thin dielectric layer 212. However, a residue portion of the thin dielectric layer 212 becomes the dielectric spacer 214, remaining on the sidewall of the trench 210 and the hard mask layer 202. The trenches 210 still expose the substrate 200.

Figure 2F:
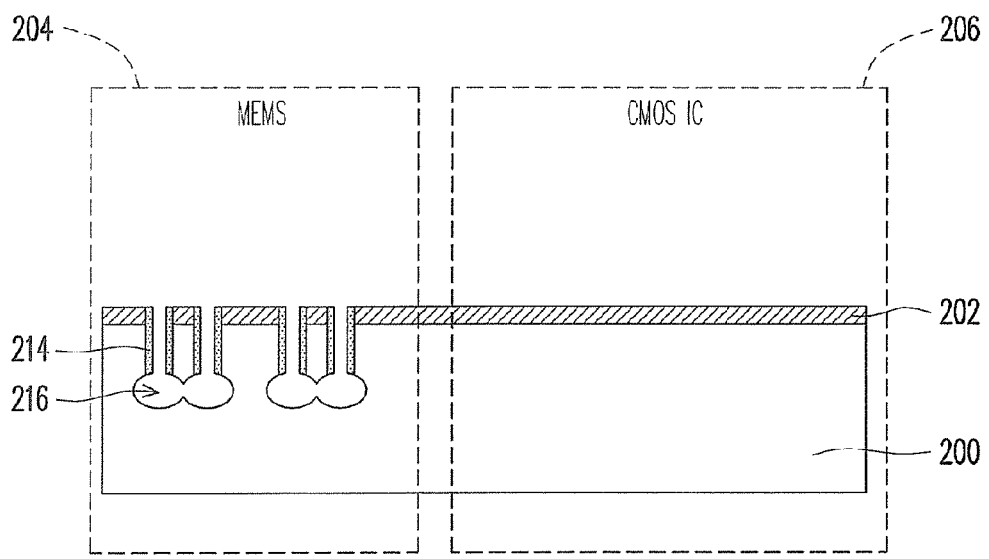

In FIG. 2F, an isotropic etching process, such as RIE process with SF6 as etchant, is performed to etch the substrate 200 in silicon material, in which the hard mask layer 202 with the dielectric spacer 214 are used as an etching mask. The isotropic etching process causes an under-cutting effect and forms a free space 216. Since the adjacent two trenches in the same group are rather close, the free spaces 216 are joined in the same group. The free space 216 would make the suspension beams in mass blocks of the MEMS structure later. The spacer 214 protects the silicon substrate 200 from being etched in this etching process.

Figure 2G:
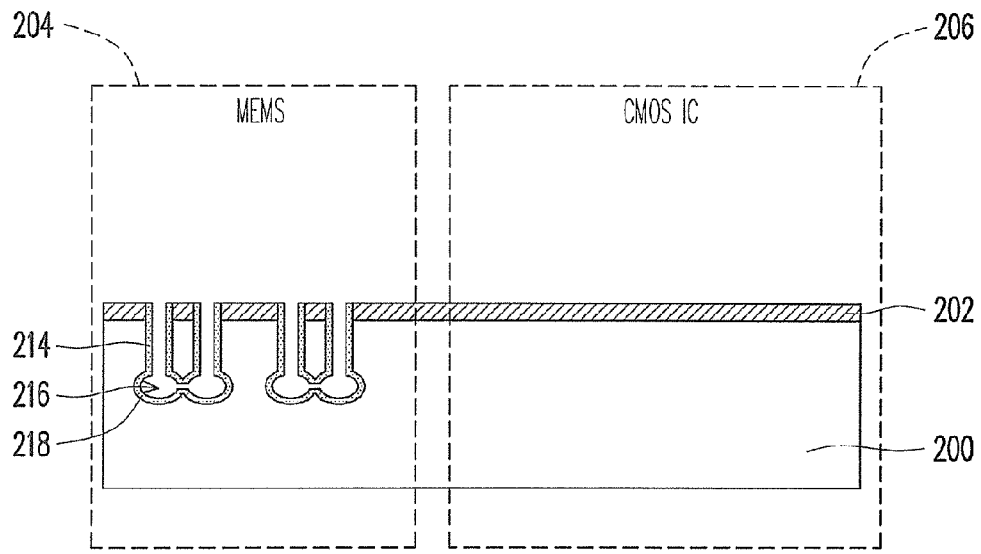
Figure 2H:
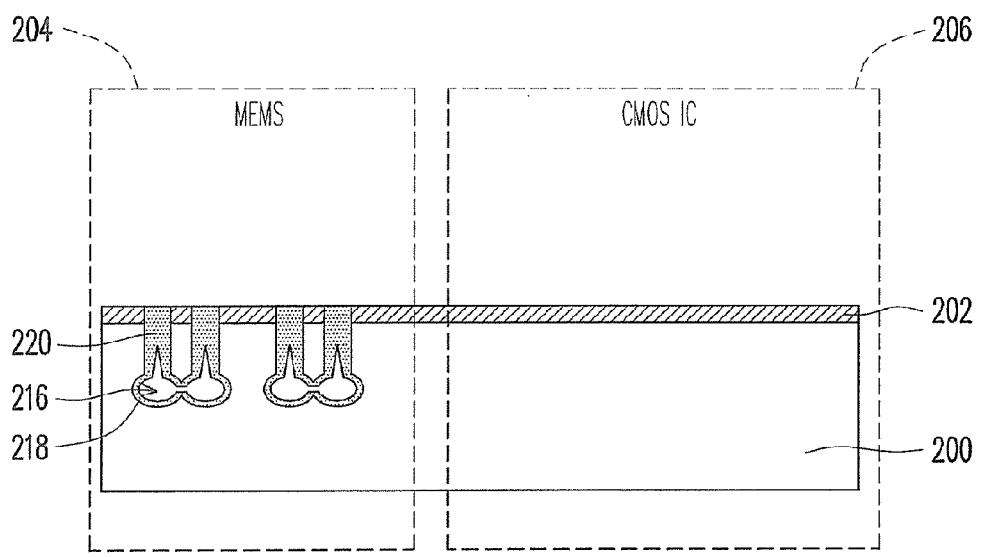

In FIG. 2G, a surface dielectric layer 218 is formed on the exposed surface of the spaces 216 by, for example, thermal oxidation as silicon oxide. In FIG. 2H, a dielectric layer 220 is filled into the trenches 210, so that the dielectric layer 220 merges with the dielectric spacer and the surface dielectric 218 as an integrated dielectric layer. Since the trenches have narrow width, the dielectric layer may not be fully filled in the space 216. This is not an issue as to be seen in subsequent process. When the dielectric 220 is to be filled into the trenches, the dielectric material is deposited over the substrate first. After the dielectric is filled into the trenches, a chemical mechanical polishing (CMP) is performed to planarize the dielectric layer and expose the hard mask layer.

Figure 2I:
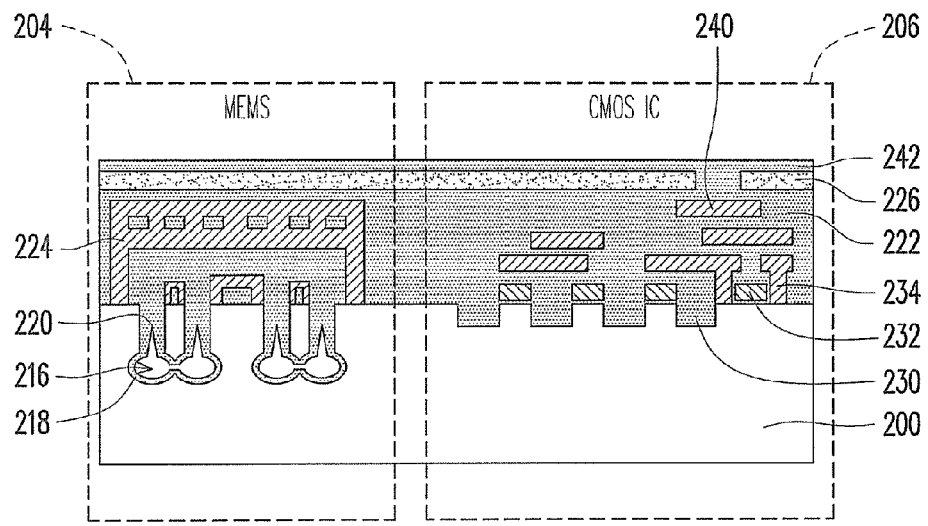
Figure 2J:
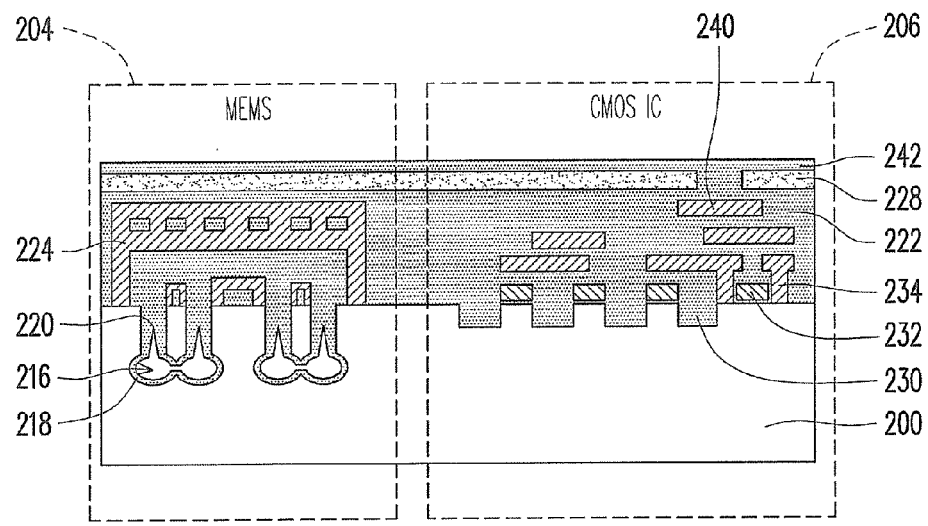

In FIG. 2I, a structural dielectric layer is formed over the substrate. Here, as known in semiconductor fabrication, the conductive structure in layer or via and the CMOS circuit are fabricated based on CMOS fabrication process using several dielectric layers step by step. The structural dielectric layer represents the necessary circuit structure embedded in the dielectric layer. In the MEMS region 204, the MEMS structure can be formed including the mass block with a suspended beam structure on the substrate 200 and a mechanical strength structure layer 224 can be formed as embedded in the dielectric layer 222. The mechanical strength structure layer 224 is conductive material such as metal or polysilicon and is used to resist the pressure force during fabrication. The mechanical strength structure layer 224 can also have the sidewall portion standing on the substrate 200 and the grid-like structure to have sufficient mechanical strength. In CMOS IC region 206, several circuit structures are fabricated as usual CMOS fabrication. The circuit structure may include, for example, isolation trench 230, gate electrode 232 of MOS transistor, the interconnect 234, and the I/O pad 240. In addition, the protection stack layer can include the hard mask layer 226 and the top passivation layer 228. The protection stack layer in material of silicon nitride or any proper material, which can at least protect the surface of the substrate from being damaged during etching process, for example. In FIG. 2J, alternatively, the protection stack layer can, for example, just use the protection layer 228 and the dielectric layer 242 on the protection layer 228 and covering the pad 240. So far, the MEMS structure and the CMOS IC have been fabricated but MEMS structure is not release yet. Depending on how to release the MEMS structure, the fabrication process may have different manners.

Figure 3A:
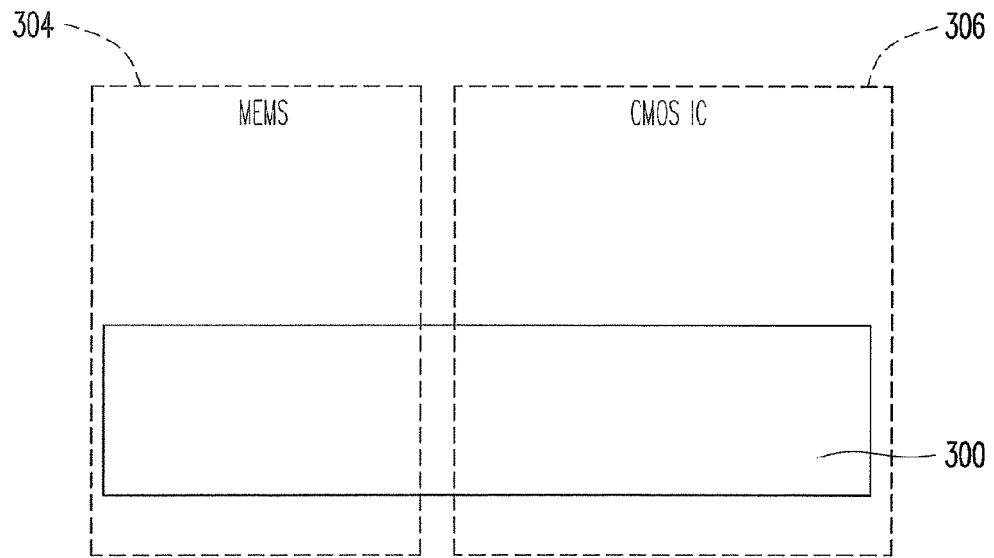
FIGS. 3A-3K are cross-sectional views, schematically illustrating the fabrication process for MEMS device with SCS MEMS structure, according to one of embodiments of the invention.
Figure 3B:
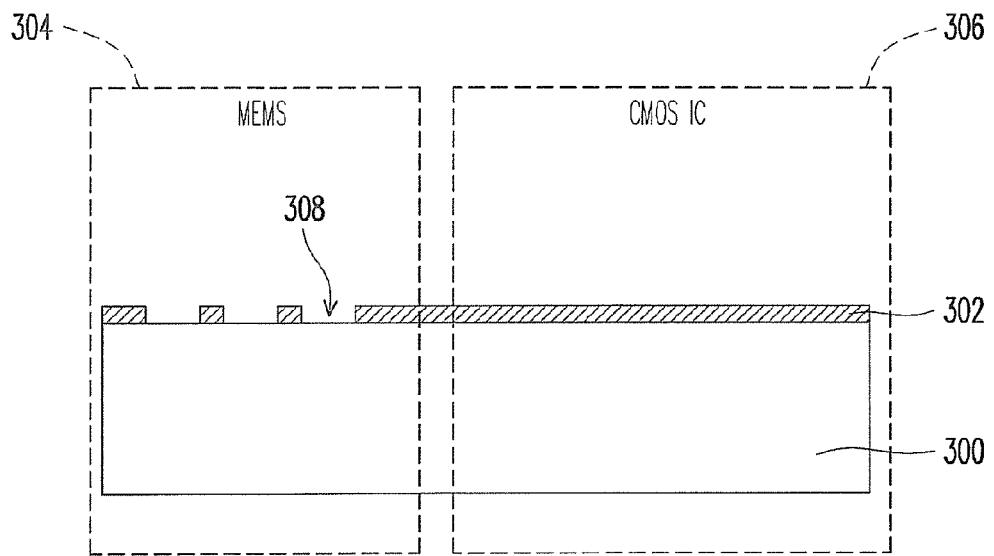

FIGS. 3A-3J are cross-sectional views, schematically illustrating the fabrication process for MEMS device, according to one of embodiments of the invention. In FIG. 3A, a substrate 300 is provided. The substrate 300 can be single crystal silicon substrate for the SCS fabrication. The substrate 300 has been configured to have a MEMS region 304 and an IC region 306. The MEMS region 304 is reserved for fabricating the MEMS device and the IC region 306 is reserved for fabricating the necessary IC, such as CMOS IC. After then, in FIG. 3B, a hard mask layer 302 is formed on the substrate 300. The hard mask layer 302 is, for example, silicon nitride, which is harder than silicon oxide. The hard mask layer 302 is patterned to form several opening patterns 308 in the MEMS region 304 to expose the substrate 300 by, for example, photolithographic process and etching process. The opening patterns 308 have the geometry shape in accordance with the MEMS structure formed later.

Figure 3C:
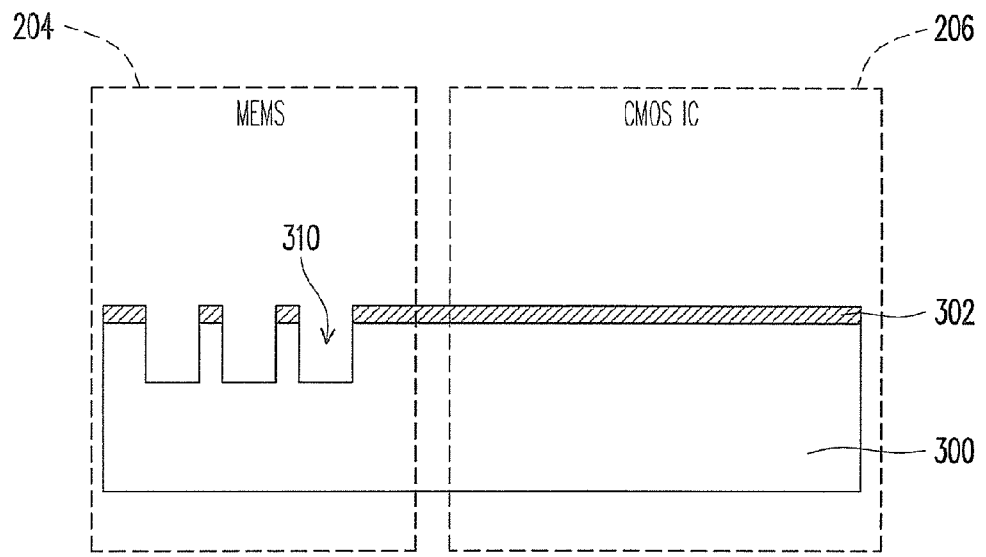

In FIG. 3C, the had mask layer 302 with the opening patterns 308 is used as an etching mask, then an anisotropic etching process can be performed on the substrate to form the trenches 310 with a predetermined depth. Width of the trenches 310 and the gap between the trenches 310 are the design choice depending on what the MEMS structure is intended.

Figure 3D:
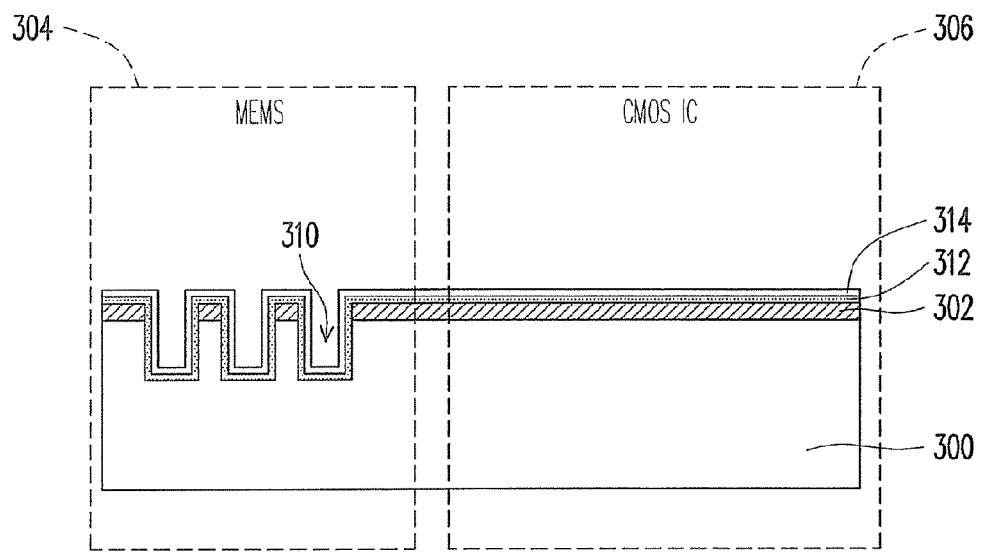

In FIG. 3D, a thin dielectric layer 312 is formed over the substrate being conformal to the structure existing over the substrate. The thin dielectric layer 312 also covers the sidewall of the trenches 310. The thin dielectric layer 2312 can be, for example, silicon oxide. A conductive layer 314 is deposited over the substrate, such as on the thin dielectric layer 312. The conductive layer 314 is also conformal to the top existing structure of the substrate 300. The conductive layer 314 can be polysilicon, for example.

Figure 3E:
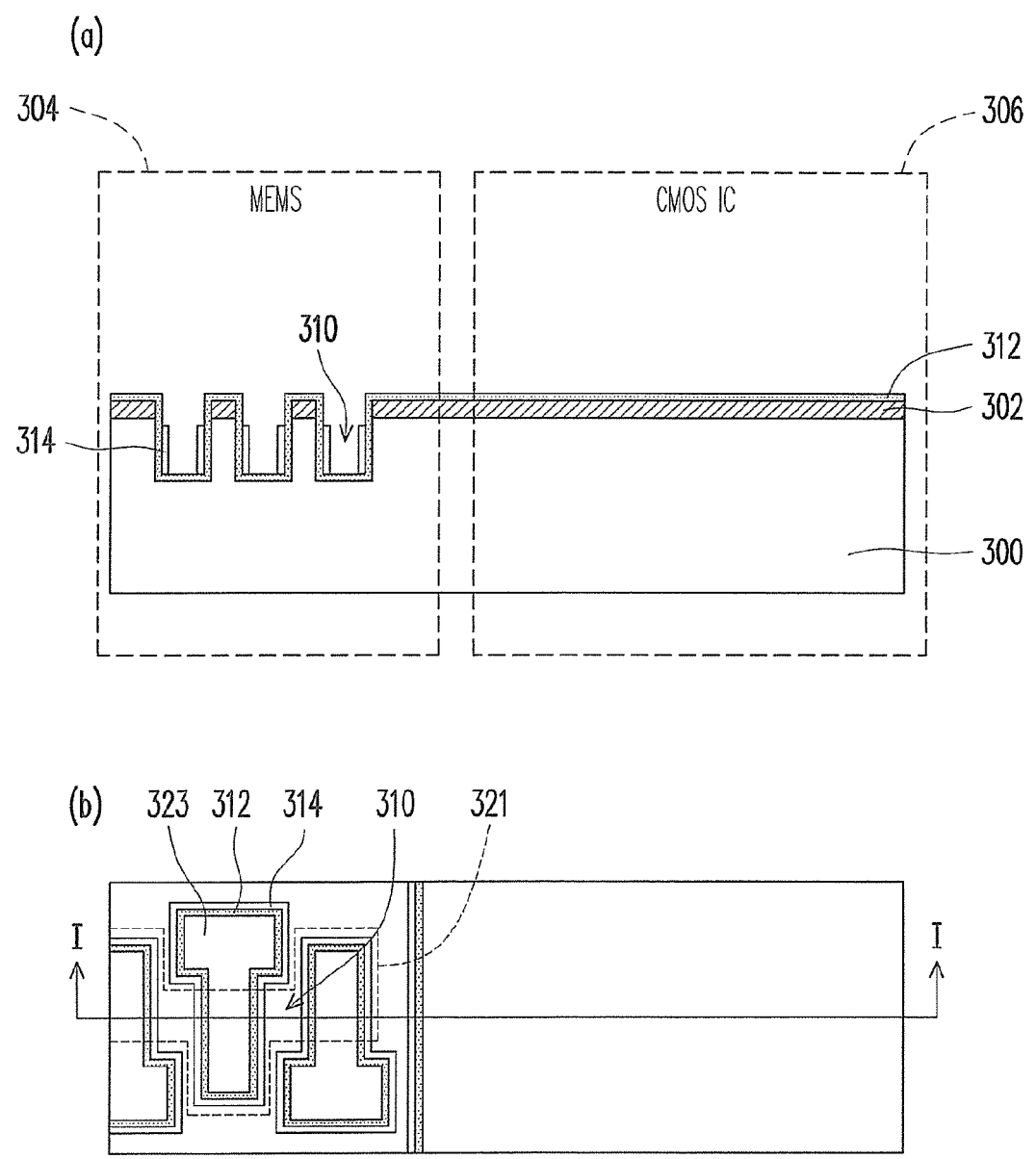

In FIG. 3E(a), an etching back process is performed to remove the conductive layer 314. A residue portion of the conductive layer 314 becomes the spacer 314 on the sidewall of the trenches 310. FIG. 3E(b) is a top view, in which the cross-sectional view at cutting line I-I is like the structure in FIG. 3E(a). The dielectric layer 312 in the top view of FIG. 3E(b) is just showing the spacer portion. It can be seen that the substrate of the MEMS structure can be, for example, T shape viewed from the periphery. The suspension beam structure 321 is then formed while the end portion is serving as the anchor 323, so as to hold the suspension beam structure 321. However, it is not the only choice but depending on how the MEMS structure is designed. In other words, the MEMS structure on the substrate has a suspension beam structure with respect to the substrate.

Figure 3F:
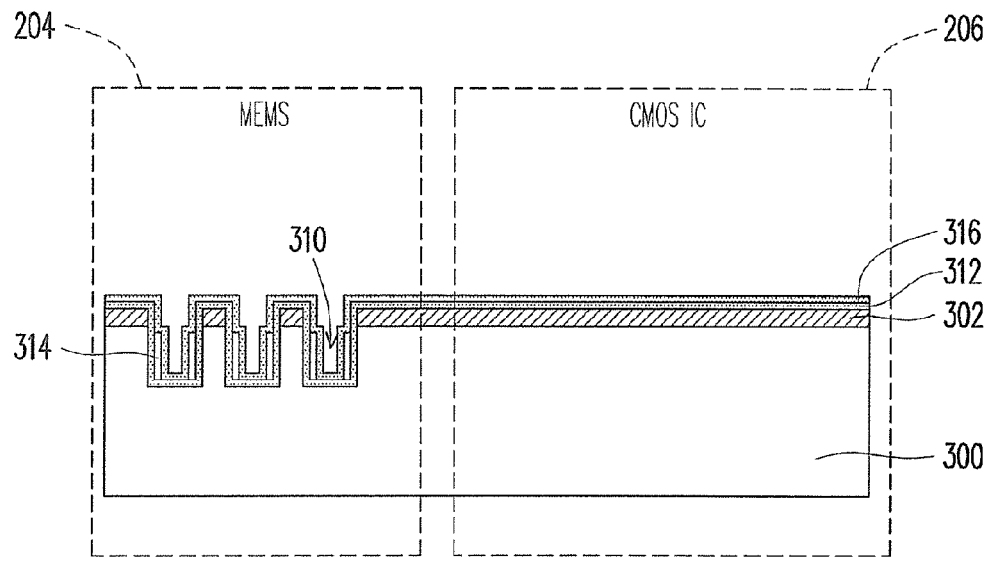
Figure 3G:
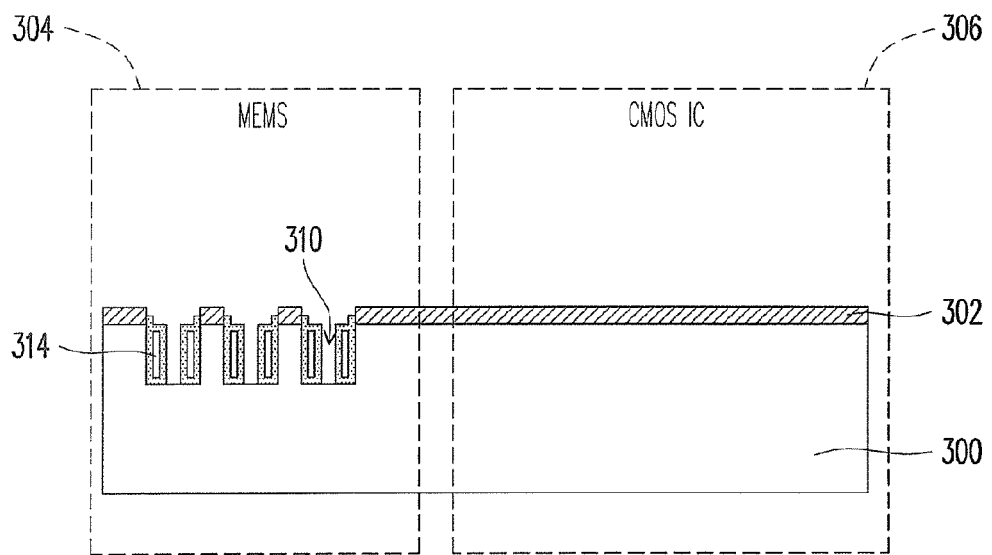

In FIG. 3F another thin dielectric layer, such as silicon oxide layer, 316 is formed over the substrate 300 in conformal manner. The thin dielectric layer in the trenches 310 also covers the conductive spacer 314 and the dielectric layer 312. In FIG. 3G, an etching back process is performed to remove the horizontal portion of the dielectric layers 312 and 316. The residue portion of the dielectric layers 312 and 316 forms a sandwiched spacer, which has the conductive spacer 314 embedded in the dielectric spacer.

Figure 3H:
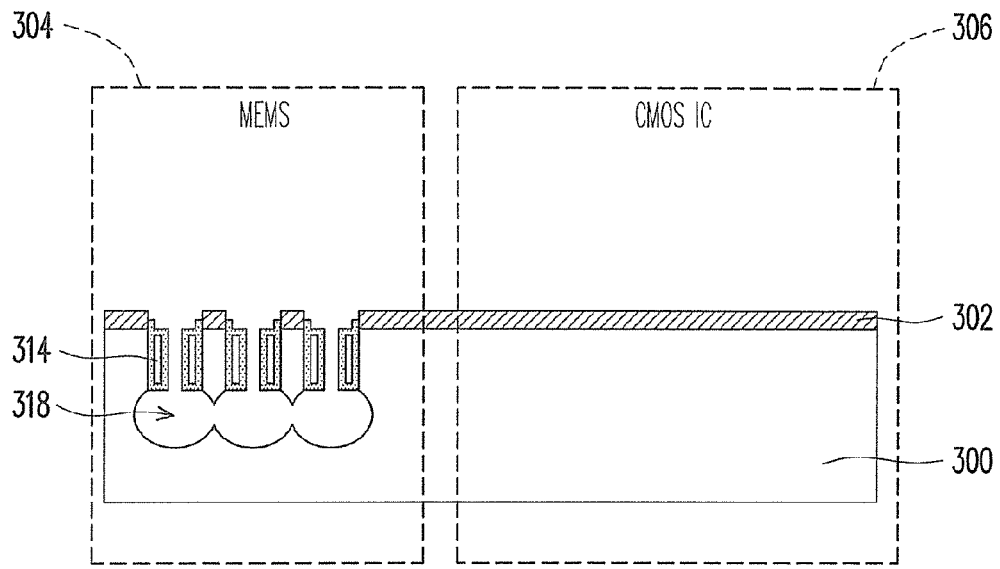
Figure 3I:
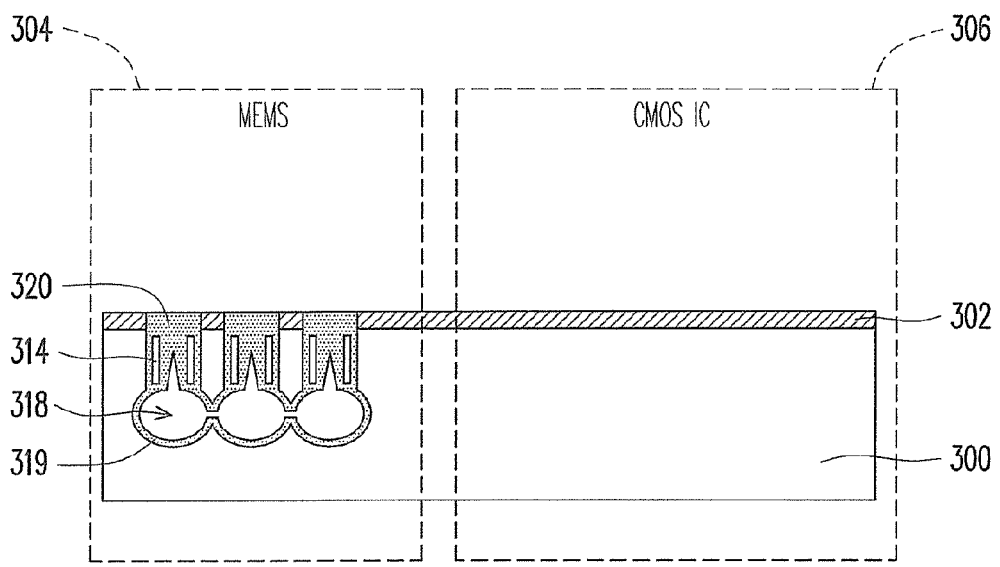

In FIG. 3H, an isotropic etching process is performed to etch the substrate under the trenches 310. In the other words, the substrate is undercut to form the free space 318. The isotropic etching process can be for example the RIE with etchant of SF6. Since the sandwiched spacer protect the sidewall of the trenches the only the substrate under the trenches is removed. In this embodiment, the spaces 318 are joined in a single space. In FIG. 3I, a thermal oxidation is performed to form the surface dielectric layer 319 on the exposed surface of the silicon substrate within the space 318.

Figure 3J:
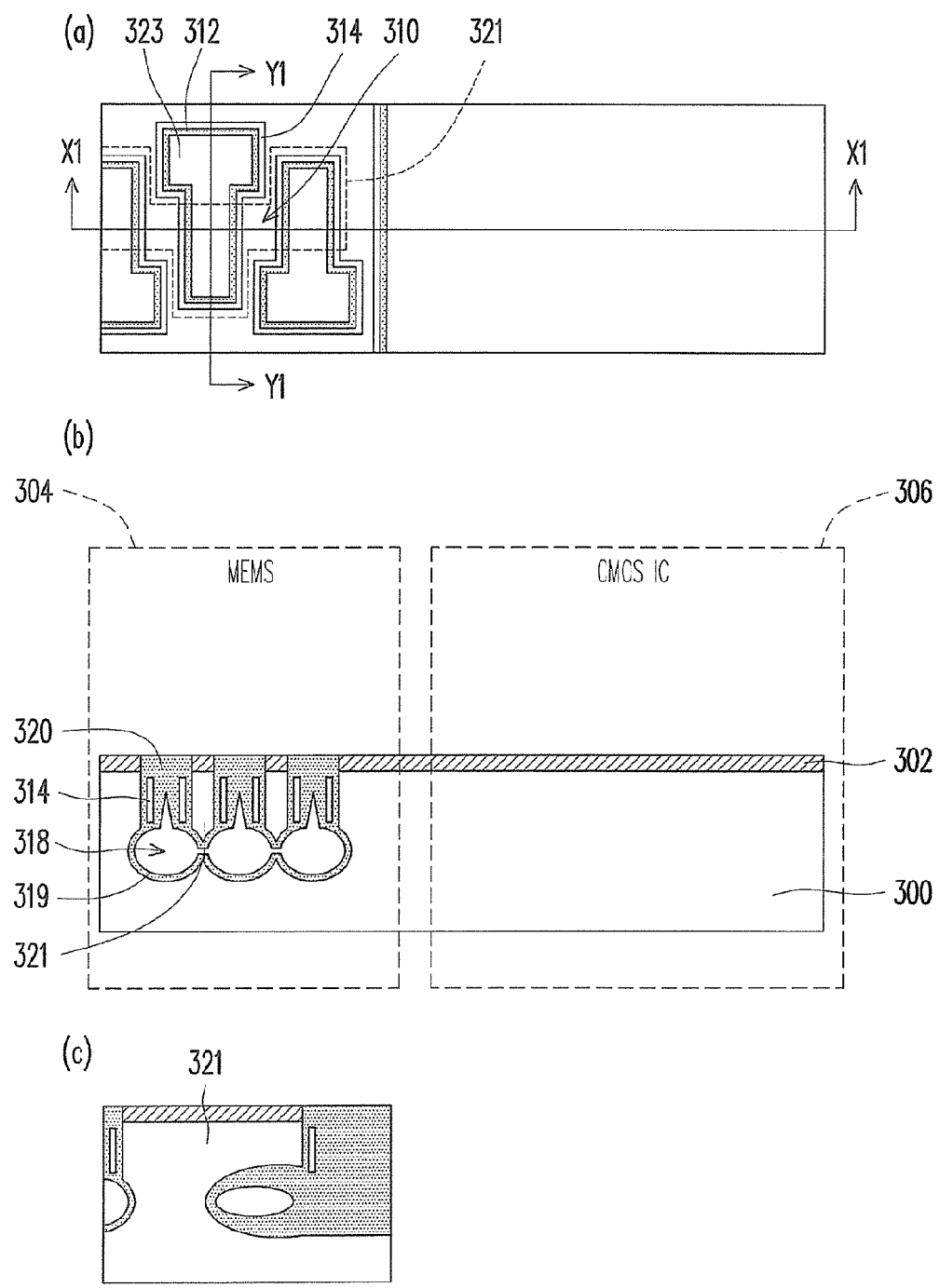

In FIG. 3J, additional cross-sectional structures in different cutting line are shown. In FIG. 3J(a), there are two cutting lines X1-X1 and Y1-Y1 with respect to the top view in FIG. 3E respectively shown in FIG. 3J(b) and FIG. 3J(c). In FIG. 3J(b), it is like FIG. 3I, however the suspension structure 321 are correspondingly shown. In FIG. 3J(c), the cross-sectional structure at the cutting line Y1-Y1 shows the suspension structure 321 as well. In other words, the suspension structure 321 can be held by the anchor 323.

Figure 3K:
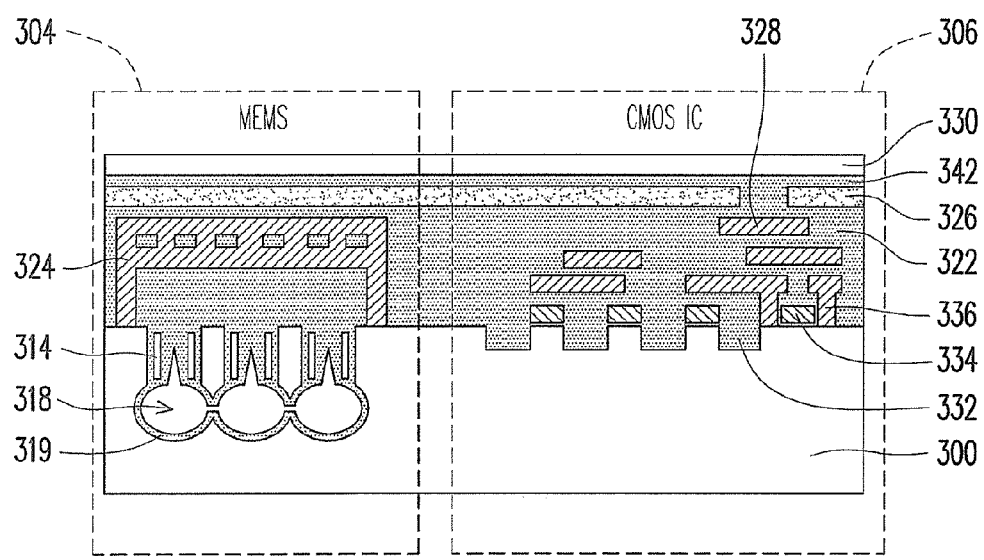

In FIG. 3K, a structural dielectric layer is formed over the substrate. Here, as known in semiconductor fabrication, the conductive structure in layer or via and the CMOS circuit are fabricated based on CMOS fabrication process using several dielectric layers step by step. The structural dielectric layer represents the necessary circuit structure embedded in the dielectric layer. In the MEMS region 304, the suspension structure of the MEMS structure in this embodiment is just from the substrate 300 and a mechanical strength structure layer 324 can be formed as embedded in the dielectric layer 322. The mechanical strength structure layer 324 is conductive material such as metal or polysilicon and is used to resist the pressure force during fabrication. The mechanical strength structure layer 324 can also have the sidewall portion standing on the substrate 300 and the grid-like structure to have sufficient mechanical strength. In CMOS IC region 306, several circuit structures are fabricated as usual CMOS fabrication. The circuit structure may include, for example, isolation trench 332, gate electrode 232 of MOS transistor, the interconnect 234, and the I/O pad 328. In addition, the protection stack layer can include the hard mask layer 326 and the top passivation layer 330. The protection stack layer in material of silicon nitride or any proper material, which can at least protect the surface of the substrate from being damaged during etching process, for example.

Alternatively like in FIG. 2J, the protection stack layer can, for example, just use the protection layer 330 for replacing the hard mask layer 326 and the dielectric layer 342 remains on the protection layer 330 for covering the pad 328. So far, the MEMS structure and the CMOS IC have been fabricated but MEMS structure is not release yet. Depending on how to release the MEMS structure, the fabrication process may have different manners.

Figure 4A:
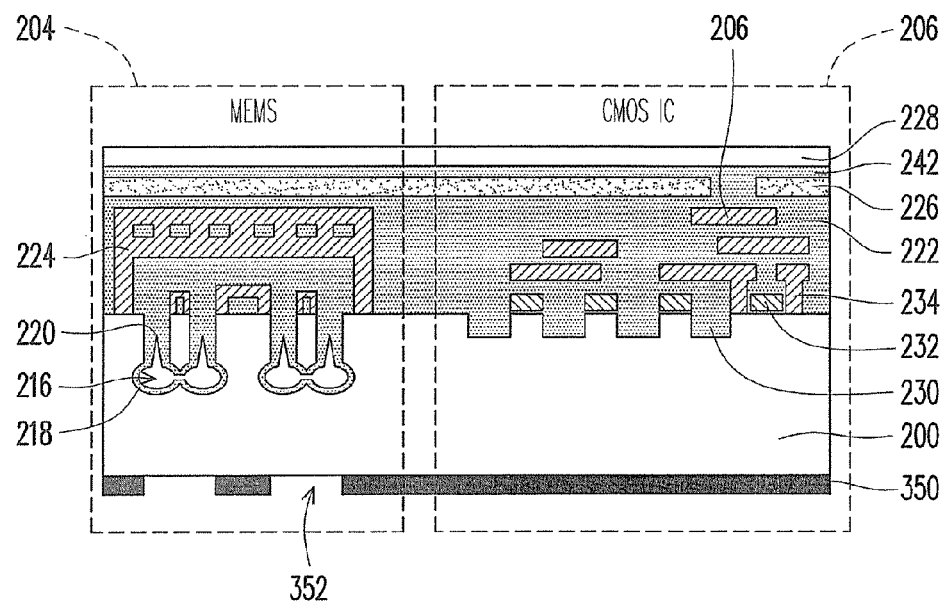
FIGS. 4A-4E are cross-sectional views, schematically illustrating the process to release the MEMS structure, according to embodiments of the invention.

The structural dielectric layer has seal the chamber from one side of the substrate. The MEMS structure is still embedded in the whole structure not being released yet. FIGS. 4A-4E are cross-sectional views, schematically illustrating the process to release the MEMS structure, according to embodiments of the invention. In FIG. 4A, taking the structure in FIG. 2I as the starting stage for releasing the MEMS structure, an etching mask layer 350 is formed on the substrate 200 from the other side, that is also known as the backside. The etching mask layer 350 is, for example, a photoresist layer and has a pattern of openings 352 to expose the substrate. The openings 352 are corresponding to the groups of the trenches.

Figure 4B:
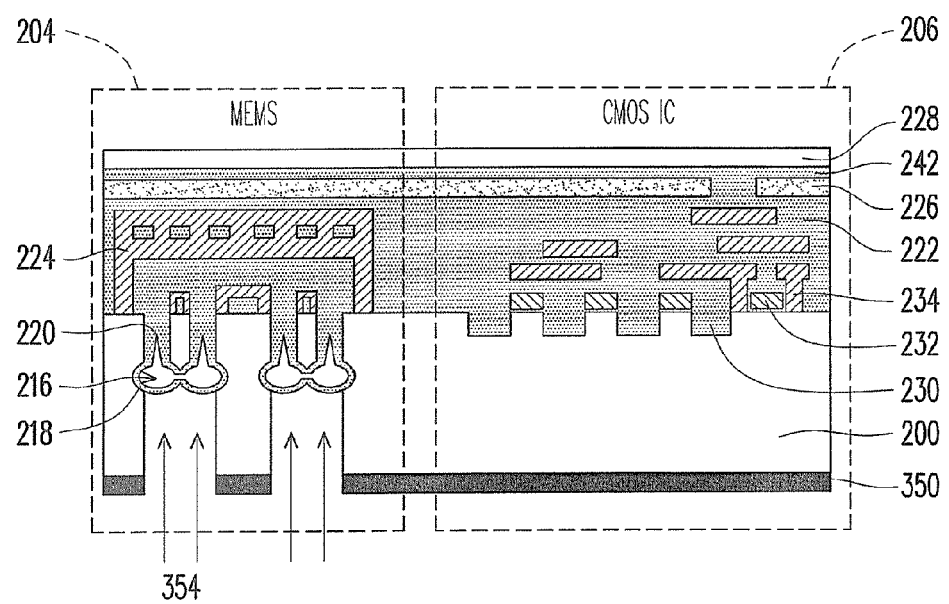

In FIG. 4B, an anisotropic etching process 354 is performed to etch the substrate 200 from the backside at the openings 352, in which the etching mask layer 350 is used as the etching mask. The anisotropic etching process 354 etches the substrate 200 and stops on the dielectric surface of the dielectric layer 218 at the MEMS region 204.

Figure 4C:
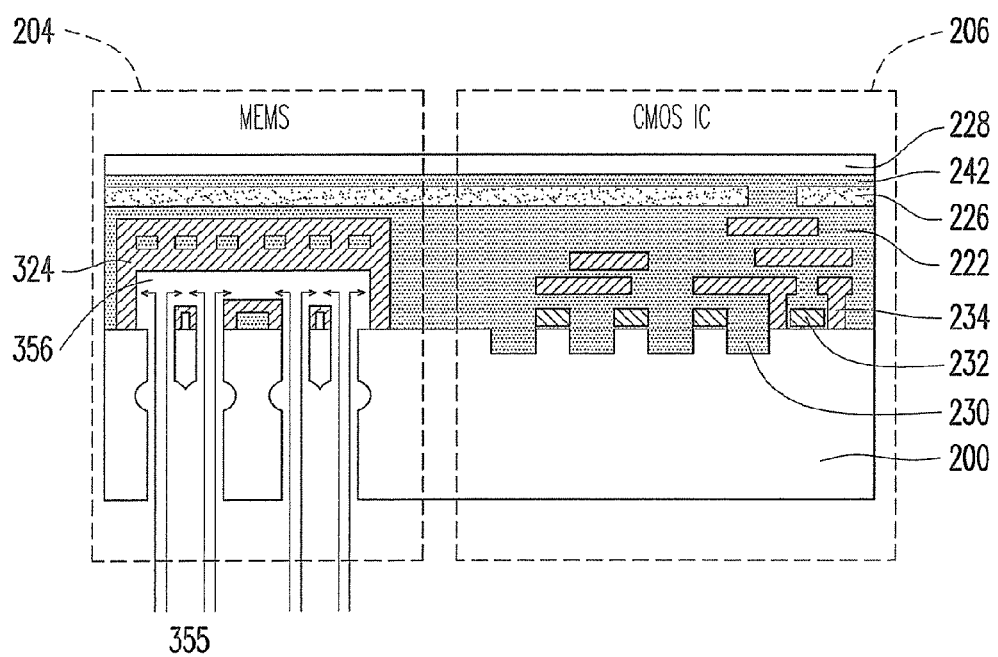

In FIG. 4C, after stripping the photoresist layer 350, an isotropic etching process 355 for the dielectric material is further performed from the backside of the substrate 200 on the exposed dielectric layer 318. Since the isotropic etching process 355 is for selectively etching dielectric material, the silicon substrate is not etched by the isotropic etching process 355. As a result, the dielectric portion 222 in the structural dielectric layer is etched and the mechanical strength structure layer 324 in conductive material is exposed. In this example, the mass blocks on the substrate 200 are also exposed. In this example, the isotropic etching process is vapor etching process, so that the etching direction as shown in arrows can go horizontal direction to isotropic etching the dielectric material.

Figure 4D:
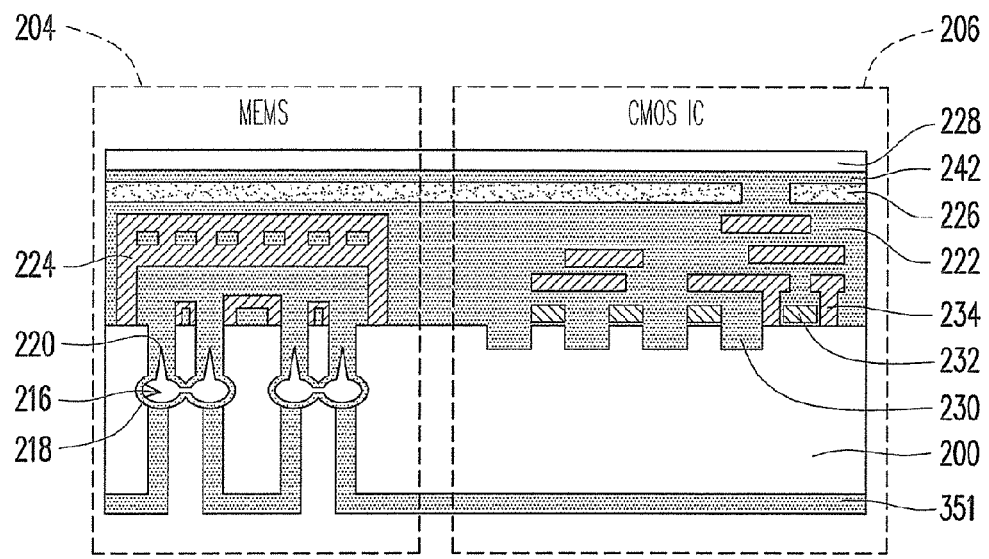
Figure 4E:
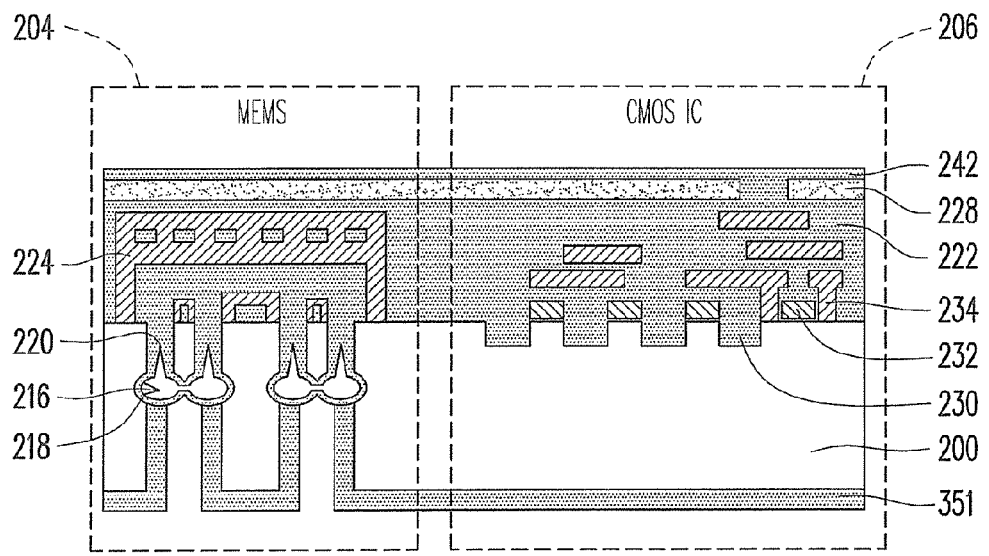

However, the isotropic etching process can also be, for example, a wet etching. In FIG. 4D, since the dielectric material 222 is etched through the narrow trenches, the etching performance may be not efficient. For the wet etching as the isotropic etching process is taken in this example, in order to have better etching efficiency, a sacrificial oxide layer 351 can be conformally formed over the substrate 200 before performing the isotropic etching process in wet etching. The sacrificial oxide layer 351 is a wettable layer for the wet etchant and the thickness is relatively thin in comparing with the structure shape, such as about 1 micron. The etching effect of sacrificial oxide layer 351 can help the wet etchant to more easily flow into the trenches as to be described in FIGS. 16A-16D. In the embodiment of FIG. 4D, the protecting stack layer is formed form the hard mask layer 226, the dielectric layer 242 and the passivation layer 228. However, in FIG. 4E, the protecting stack layer can also be formed from the passivation layer 228 and the dielectric layer 242. The etching mask layer 351 for the isotropic etching process can also be used. In other words, the combination of embodiments from each other can be properly made.

Figure 15:
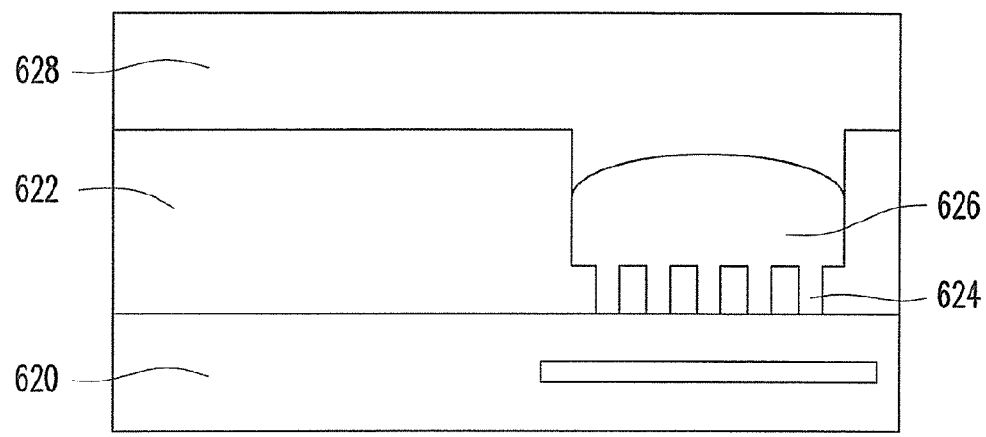
FIG. 15 is a cross-sectional view, schematically illustrating a structure of MEMS structure under etching in concerning by the present invention.

FIG. 15 is a cross-sectional view, schematically illustrating a conventional structure of MEMS structure under etching in concerning by the present invention. Since the MEMS structure needs to perform the wet etching process through the narrow hole to release the MEMS suspension beam, the wetting process may have the issue due to a stop by the bubble. In FIG. 15, it shows how the bubble stops the wet etchant into the dielectric layer to release the MEMS structure. For the general structure, silicon substrate 622, such at the backside, has the open for etching the dielectric layer 620 through the venting holes or channels 624. In general, the wet etchant 628 for the etching of dielectric 620 e.g. silicon oxide is dilute HF ($HF+H_2O$) or buffered oxide etch (BOE) by $NH_4F+HF+H_2O$. However, such etching solution as the etchant to etch the silicon oxide has to pass by the silicon surface and reach the silicon layer for many cases on MEMS application. Unfortunately, the silicon surface is hydrophobic for those etching solution. Therefore, if the silicon oxide layer is to be etched via the silicon vent holes cavity 6204 or channels, the bubble 626 is very easy to form in the holes or channels and stops the etchant to reach the silicon oxide when the samples are immerged into the buffered oxide etch solution (BOE) or dilute HF.

Figure 16A:
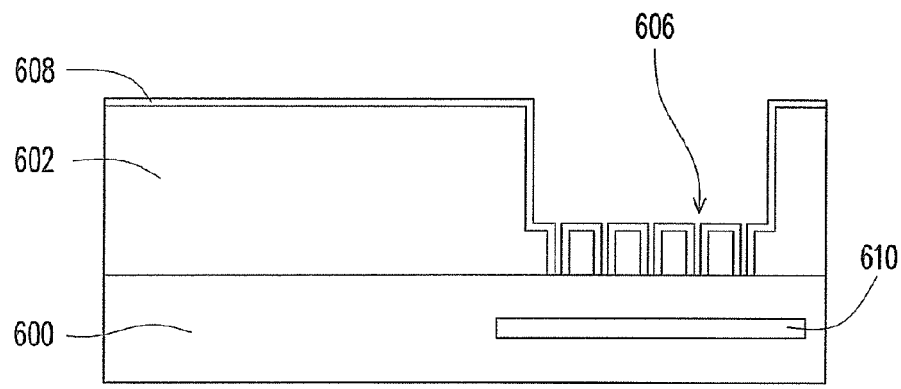
FIGS. 16A-16D describes how to send the etchant to dielectric via the holes, cavity or channels in silicon, according to one of embodiment of the invention.

FIGS. 16A-16D describes how to send the etchant to dielectric via the holes, cavity or channels in silicon, according to one of embodiment of the invention. In FIG. 16A, in order to etch the dielectric layer 600 through the trenches 606 of the substrate 602, a silicon oxide layer 608 is formed over the substrate 602 before the wet etching process. Because the oxide is very easy to react with buffered oxide etching solution or dilute HF, the etchant is easy to wet the surface the oxide. Moreover, the silicon oxide is hydrophilic. Using this way, the bubble in the silicon holes, cavity, or channels can be escaped easily without special recipe added into the etching solution.

Figure 16B:
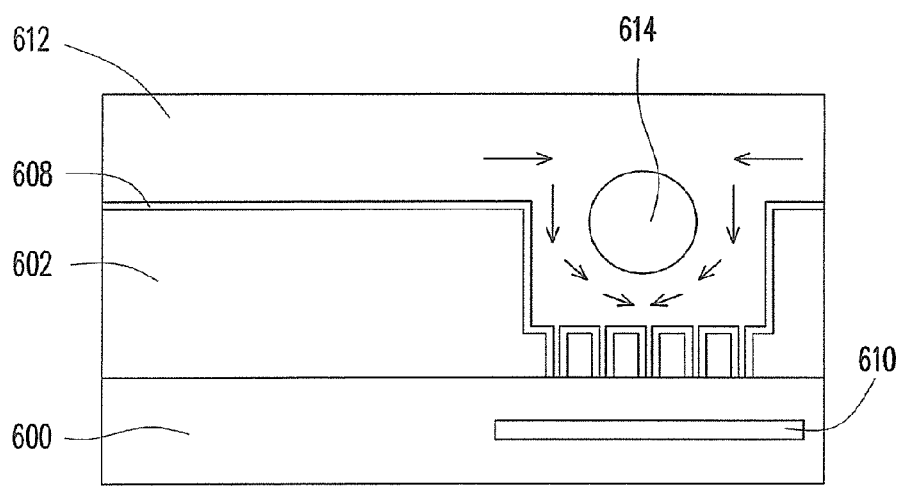
Figure 16C:
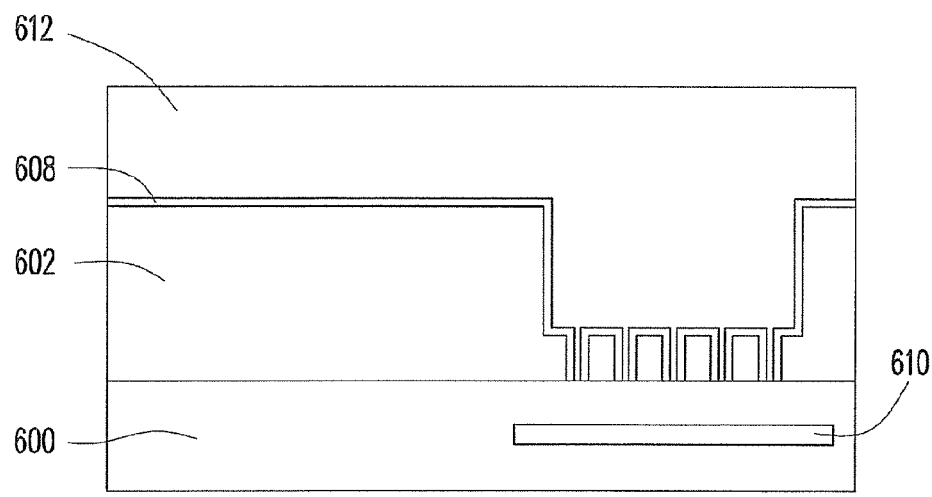
Figure 16D:
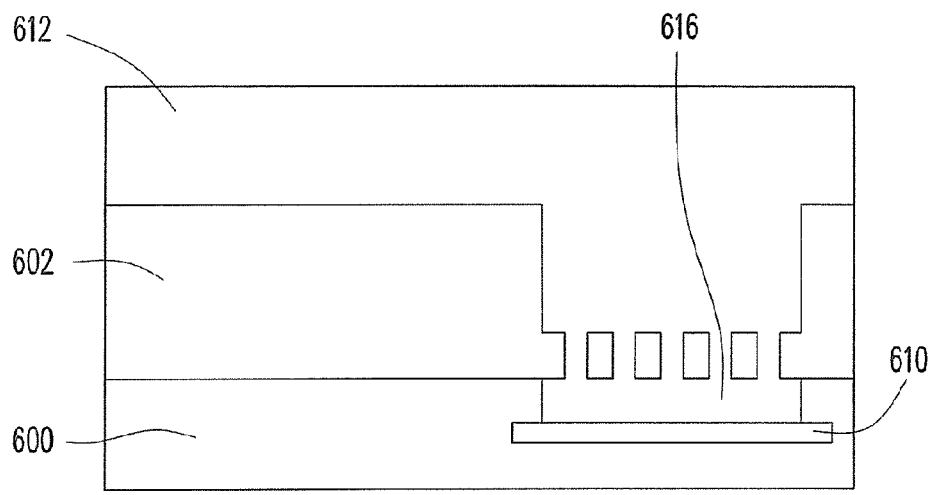

In FIG. 16B, the wet etchant 612 is applied to the cavity of the substrate 602. In this situation, due to the effect of the silicon oxide layer 608, the bubble 614 can be easily expelled out. In FIG. 16C, after the wet etchant 612 is applied for a while, the wet etchant 612 can react with the silicon layer 608 and smoothly enters the trenches for starting to etch the dielectric material in the structural dielectric layer 600. In FIG. 16D, as a result, the silicon oxide layer 608 and the dielectric portion 616 in the structural dielectric layer 600 are etched away and the etching process stops on the conductive layer 610.

Figure 5A:
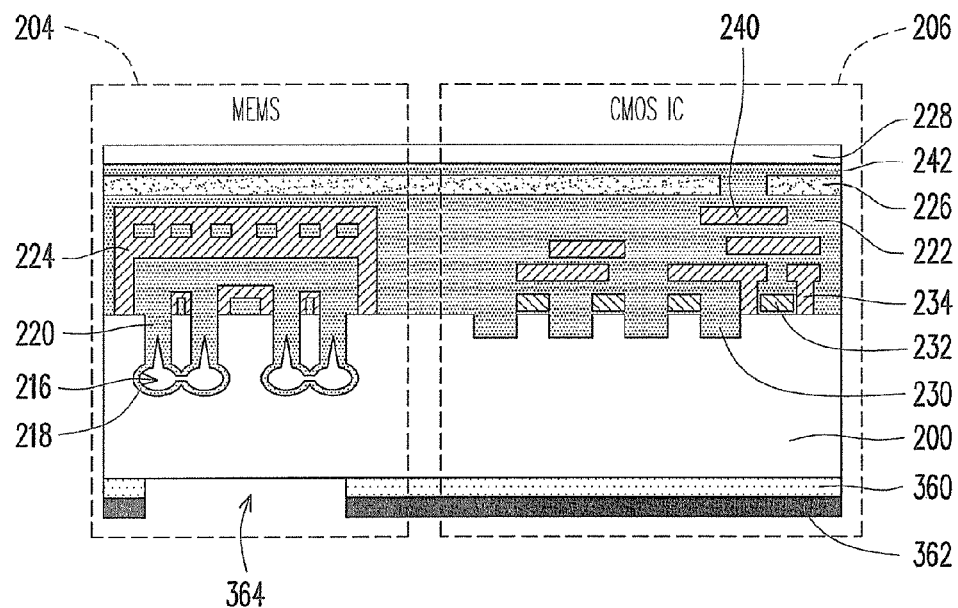
FIGS. 5A-5E cross-sectional views, schematically illustrating the process to release the MEMS structure, according to one of embodiments of the invention.

FIGS. 5A-5E cross-sectional views, schematically illustrating the process to release the MEMS structure, according to one of embodiments of the invention. In order to have multiple height levels for the MEMS structure, the substrate can be etched in different manner. In FIG. 5A, a preliminary hard mask layer 360 is formed on the substrate 200. A photoresist layer 362 with an opening is formed on the hard mask layer 360. After etching the hard mask layer 360 with the photoresist layer 362 as an etching mask, the hard mask layer 360 is patterned to have the opening 364 to expose the substrate 200. The opening 364 has a region corresponding to the trenches.

Figure 5B:
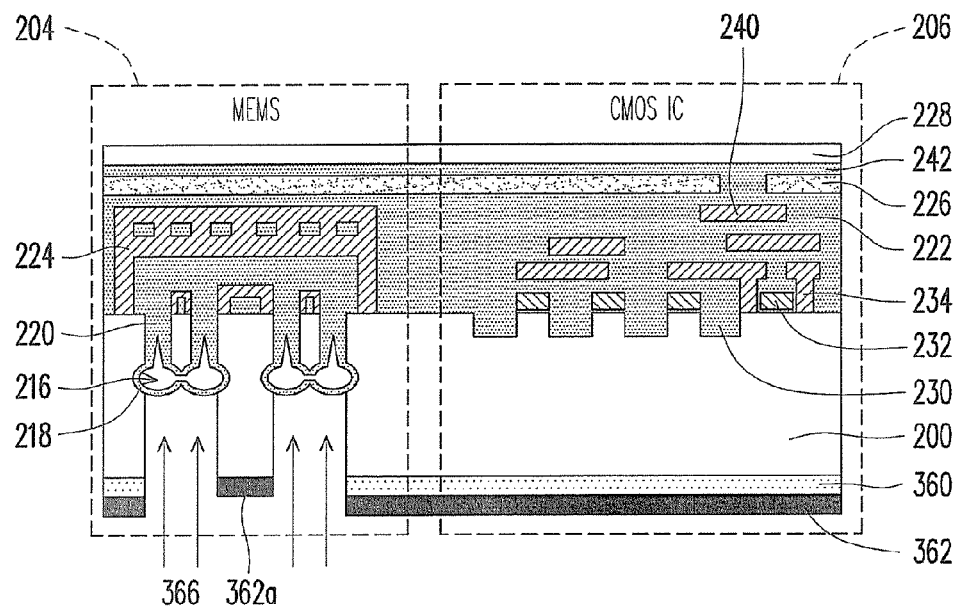

In FIG. 5B, another photoresist layer 362a is formed on the substrate 200 within the opening 364. The previous photoresist layer 362 may still remain or a new one. A portion of the substrate 200 within the opening 364 is still exposed. Then an anisotropic etching process 366 is performed to etch the substrate 200 from the exposed surface. As a result, the anisotropic etching process 366 for selectively etching silicon substrate and stops on the dielectric layer 218.

Figure 5C:
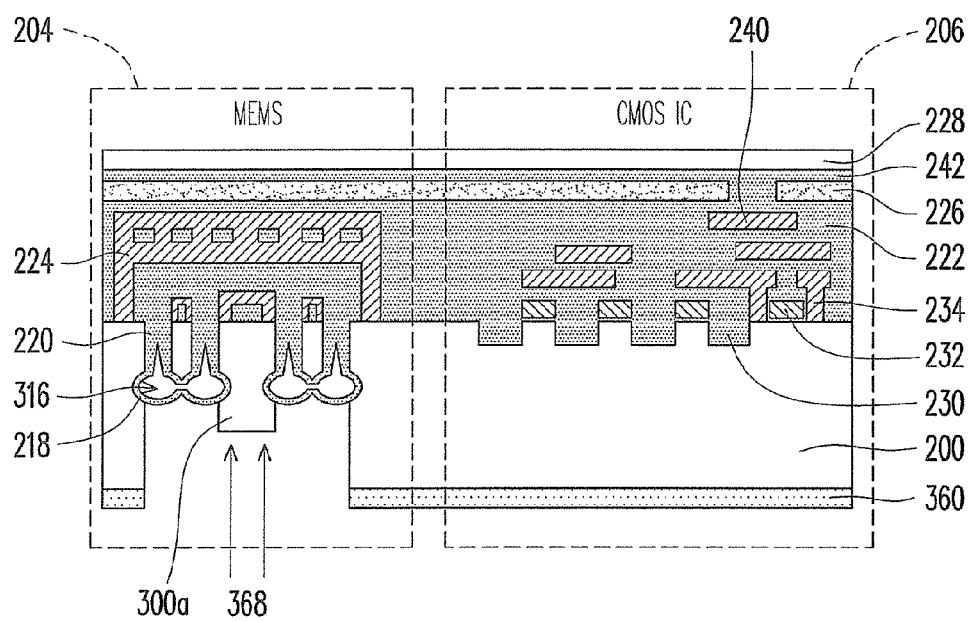

In FIG. 5C, the photoresist layer 362 is stripped away but the hard mask layer 3600 still remains to serve as an etching mask to substrate 200. Another anisotropic etching process 368 for the silicon substrate 200 is performed. As a result the substrate portion 300a in the anisotropic etching process 368 is etched to have different height level.

Figure 5D:
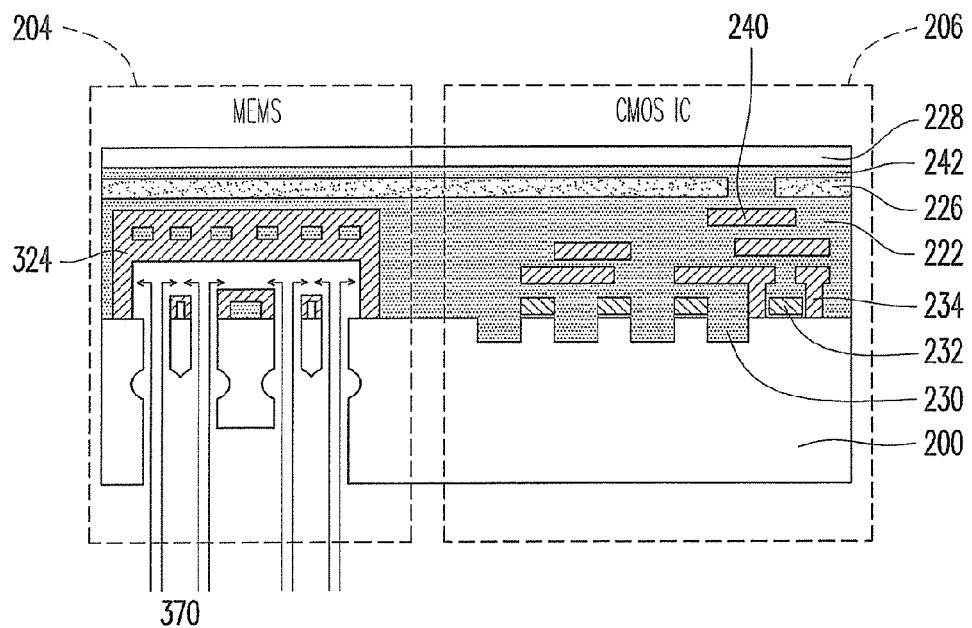

In FIG. 5D, another isotropic etching process 370 is performed to etch dielectric material. As a result, the MEMS structure is released and the mechanical strength structure layer 324 is exposed as well. The mass block of the MEMS structure includes a portion of the substrate in two levels for this example. The isotropic etching process 370 can be vapor etching.

Figure 5E:
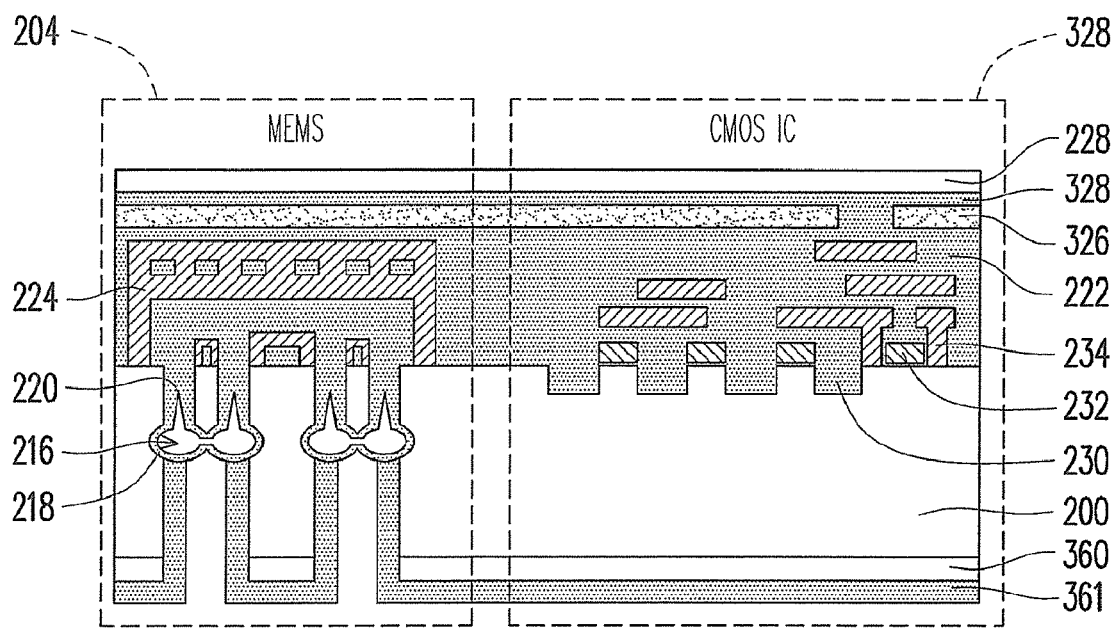

In FIG. 5E, as discussed in FIGS. 15A-15D, the isotropic etching process 370 can also be wet etching. In wet etching, the silicon oxide layer 361 can be formed over the substrate 200. The effect of the silicon oxide layer 361 is the same as previous description for helping the wet etchant to enter the narrow trenches, so as to etch the dielectric 222 in the structural dielectric layer.

Figure 6:
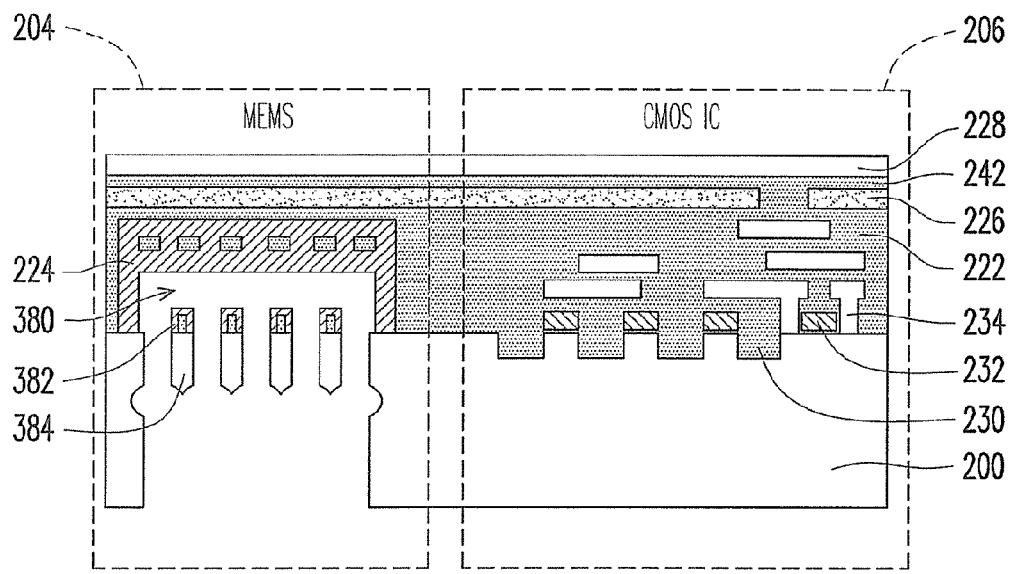
FIG. 6 is a cross-sectional view, schematically illustrating the process to release the MEMS structure, according to one of embodiments of the invention.

FIG. 6 is a cross-sectional view, schematically illustrating the process to release the MEMS structure, according to one of embodiments of the invention. In FIG. 6 for alternative structure with a single level, it can be formed by the previous process. However, the substrate portions 384 of the released MEMS structure have the level. In option, the mass blocks 382 can be on the substrate portions 384 depending on the actual need. The chamber 380 is formed but not being sealed as a hermetic chamber yet. The packaging process to seal the chamber will be described later.

Figure 7:
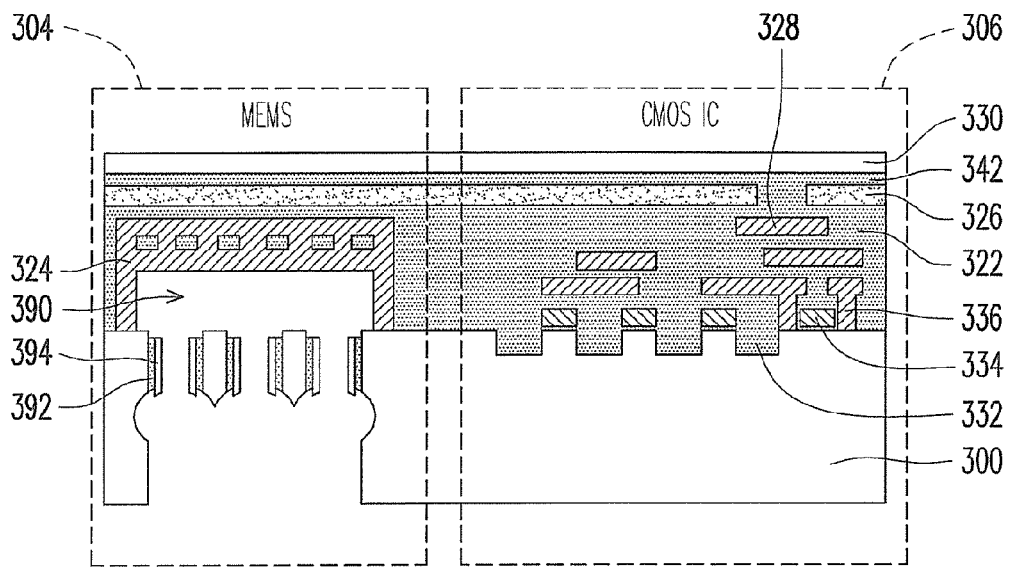
FIG. 7 is a cross-sectional view, schematically illustrating the process to release the MEMS structure, according to one of embodiments of the invention.

FIG. 7 is a cross-sectional view, schematically illustrating the process to release the MEMS structure, according to one of embodiments of the invention. In FIG. 7, the structure is the subsequent process from the structure in FIG. 3J. As previously described, the photoresist layer as an etching mask can be formed on the substrate 300 from the backside. The photoresist layer has an opening in the MEMS region 304 corresponding to the MEMS structure to be released. An anisotropic etching process is performed with the photoresist layer as the etching mask, the dielectric material is removed until the MEMS structure is released and the mechanical strength structure layer 324 is exposed and the chamber 390 is formed. The dielectric spacer 392 and the conductive spacer 394 remains on the sidewall of the trenches. The chamber 390 is formed but not being sealed as a hermetic chamber yet. The packaging process to seal the chamber will be described later.

As described above, the MEMS structure can be formed in different process to have the desired structure. However, the fabrication principle is the same that the structural dielectric layer with the embedded structure, including conductive circuit structure and the mechanical strength structure layer at the MEMS region can be formed while the CMOS IC can be formed at the CMOS IC region. The conductive circuit structure may include capacitance and interconnect, for example. The CMOS IC region can be formed with the necessary CMOS IC. The structural dielectric layer is also seal the chamber from the top side.

Figure 8A:
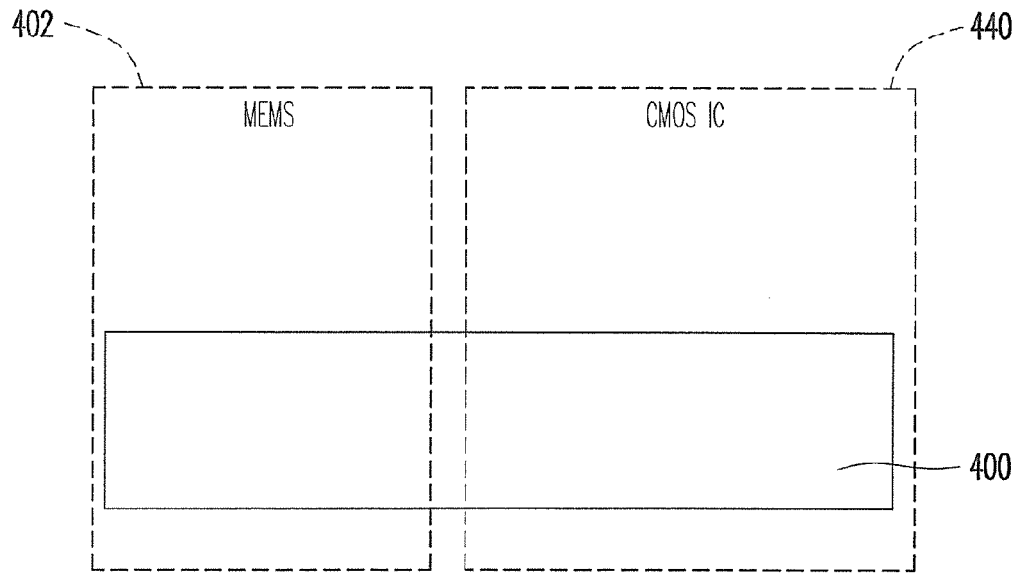
FIGS. 8A-8K are cross-sectional views, schematically illustrating the fabrication process for MEMS device with SCS MEMS structure, according to one of embodiments of the invention.
Figure 8B:
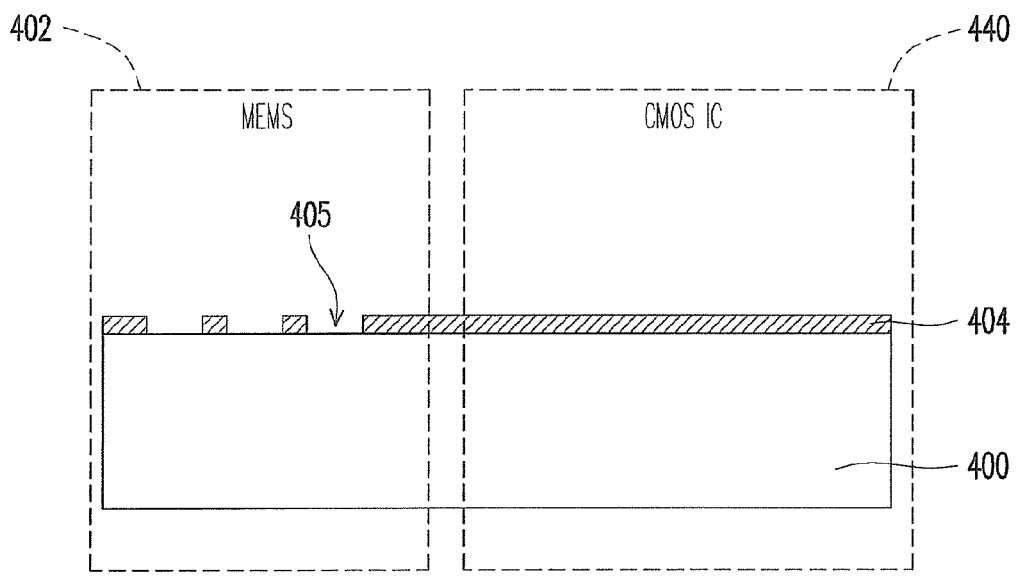

FIGS. 8A-8K are cross-sectional views, schematically illustrating the fabrication process for MEMS device with embedded hermetic chamber, according to one of embodiments of the invention. In FIG. 8A, a substrate 400 is provided. The substrate 400 can be single crystal silicon substrate for the SCS fabrication. The substrate 400 has been configured to have a MEMS region 402 and an IC region 440. The MEMS region 402 is reserved for fabricating the MEMS device and the IC region 440 is reserved for fabricating the necessary IC, such as CMOS IC. After then, in FIG. 8B, a hard mask layer 404 is formed on the substrate 400. The hard mask layer 404 is, for example, silicon nitride, which is harder than silicon oxide. The hard mask layer 404 is patterned to form several opening patterns 405 in the MEMS region 402 to expose the substrate 400 by, for example, photolithographic process and etching process. The opening patterns 405 have the geometry shape in accordance with the MEMS structure formed later.

Figure 8C:
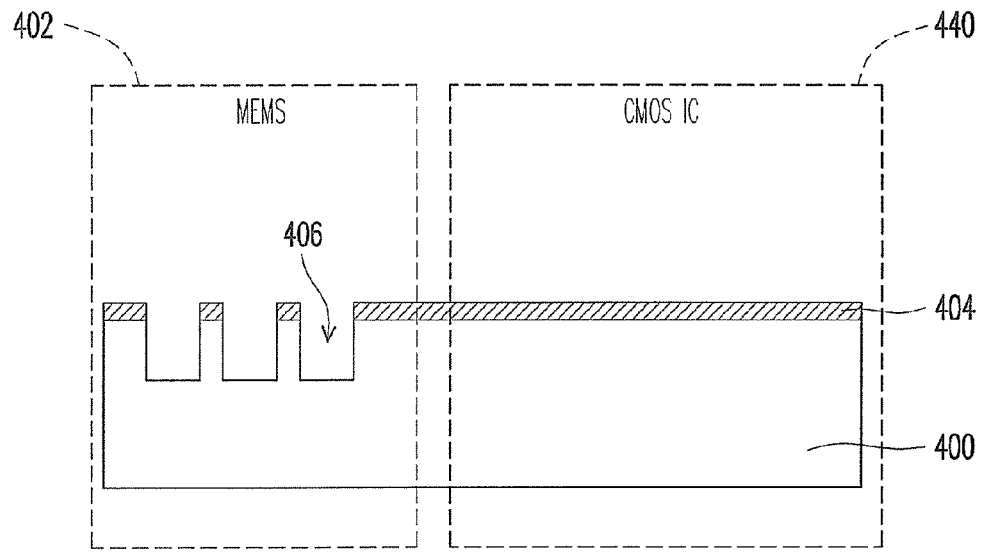

In FIG. 8C, the had mask layer 404 with the opening patterns 406 is used as an etching mask, then an anisotropic etching process can be performed on the substrate 400 to form the trenches 406 with a predetermined depth. Width of the trenches 406 and the gap between the trenches 406 are the design choice depending on what the MEMS structure is intended.

Figure 8D:
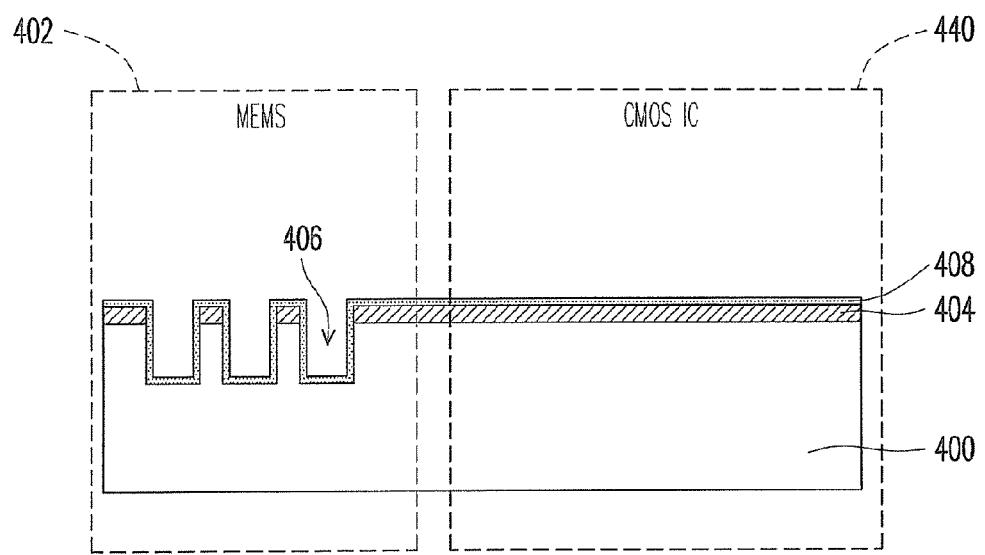
Figure 8E:
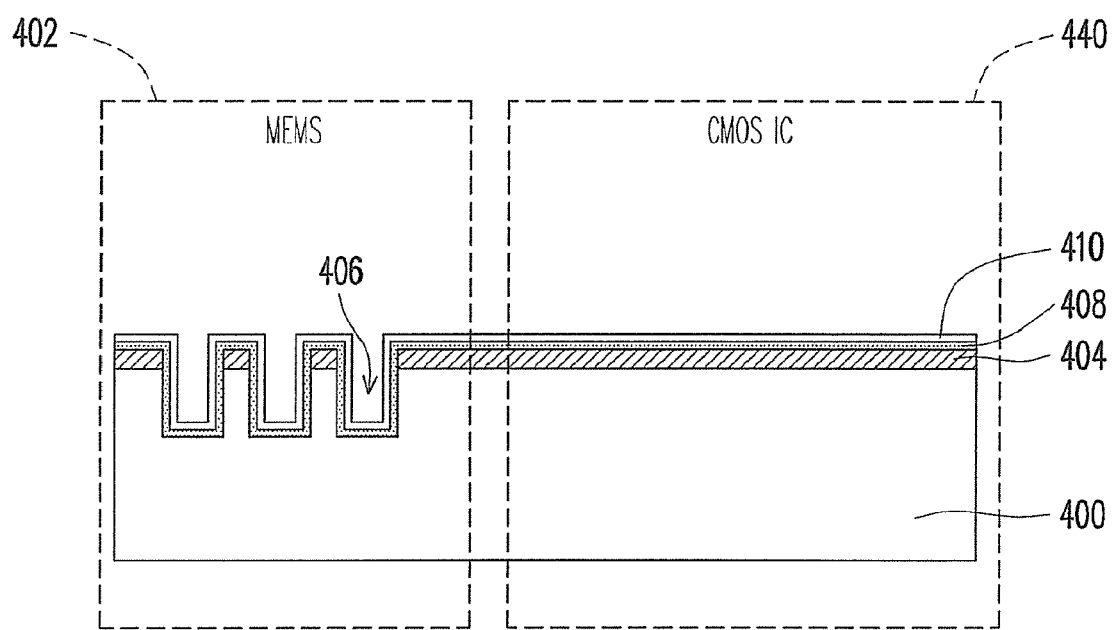
Figure 8F:
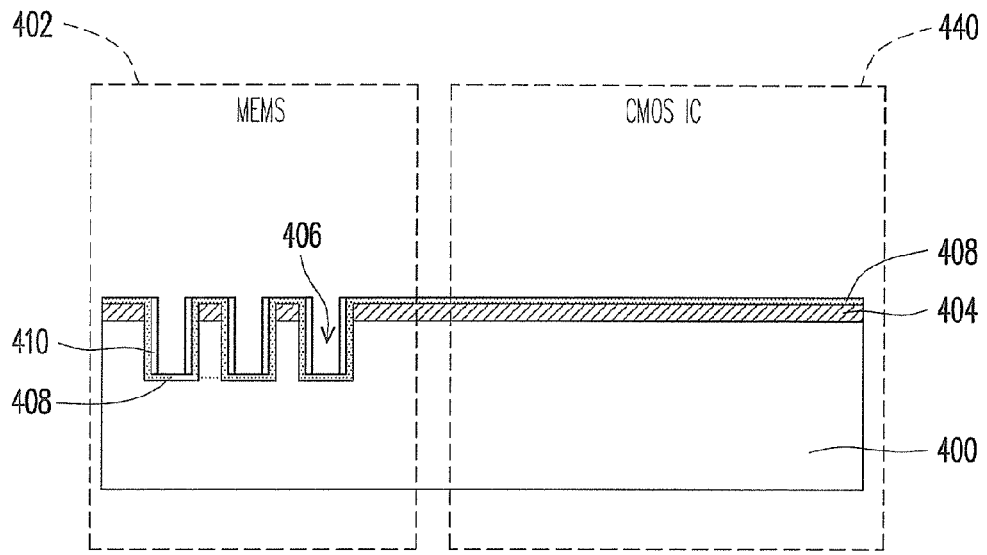
Figure 8F:
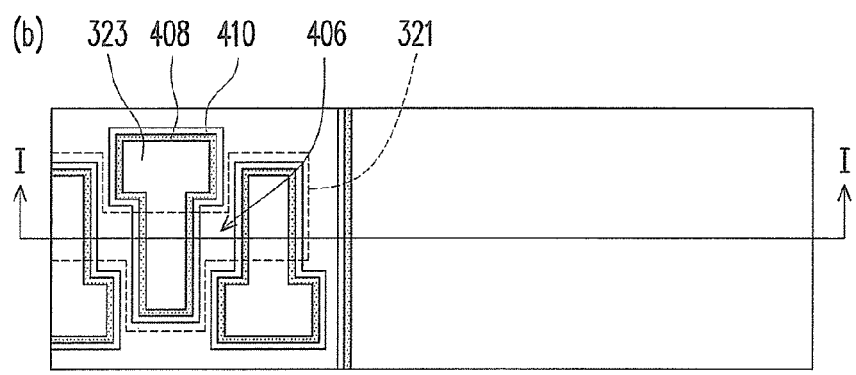

In FIG. 8D, a thin dielectric layer 408, such as silicon oxide, in conformal shape is formed over the substrate 400. The dielectric layer 408 covers the sidewall of the trenches 406. In FIG. 8E, a conductive layer 410 in conformal shape is formed on the dielectric layer 408. The conductive layer 410 can be polysilicon, for example. In FIG. 8F(a), an etching back process is performed on the conductive layer 410 to remove the horizontal portion. The residue portion of the conductive layer 410 becomes a conductive spacer on the dielectric layer 408 over the sidewall of the trenches 406. In FIG. 8F(b), it is a part of the top view for the structure in FIG. 8F(a), which is cutting at the line I-I, in which the horizon portion of the dielectric layer 408 is not shown but just the spacer is shown. As can be seen, the substrate 400 of the MEMS structure can be, for example, T shape view from the periphery. In addition, the suspension beam structure 321 is held by the anchor 323 as shown at top view in FIG. 8F. However, it is not the only choice but depending on how the MEMS structure is designed. In other words, the MEMS structure has the suspension structure in the mass blocks.

Figure 8G:
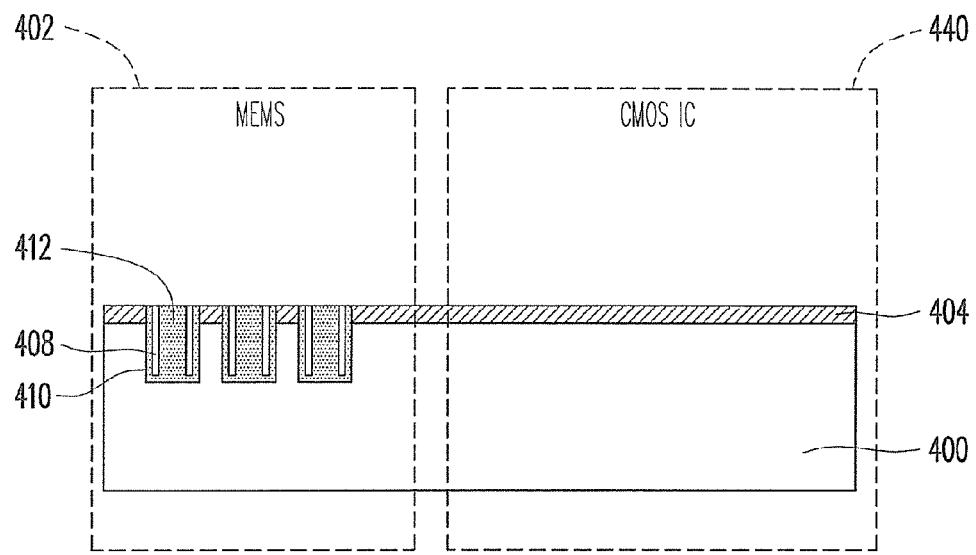

In FIG. 8G, the trenches 406 are filled with dielectric layer 412. When the dielectric 412 is to be filled into the trenches 406, the dielectric material is deposited over the substrate 400 first. After the dielectric 412 is filled into the trenches 406, a chemical mechanical polishing (CMP) is performed to planarize the dielectric layer and expose the hard mask layer 404.

Figure 8H:
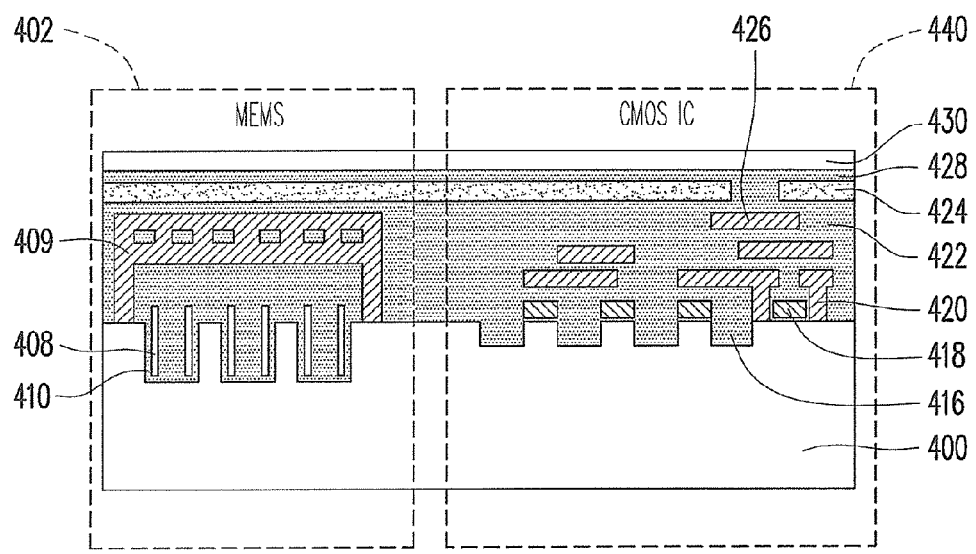

In FIG. 8H, as previously described, the structural dielectric layer is formed over the substrate 400. Here, as known in semiconductor fabrication, the conductive structure in layers or via and the CMOS circuit are fabricated based on CMOS fabrication process using several dielectric layers step by step. The structural dielectric layer represents the necessary circuit structure embedded in the dielectric layer. In the MEMS region 402, the suspension structure of the MEMS structure in this embodiment is just from the substrate 400 and a mechanical strength structure layer 409 can be formed as embedded in the dielectric layer 422. The mechanical strength structure layer 409 is conductive material such as metal or polysilicon and is used to resist the pressure force during fabrication. The mechanical strength structure layer 409 can also have the sidewall portion standing on the substrate 400 and the grid-like structure to have sufficient mechanical strength. In CMOS IC region 440, several circuit structures are fabricated as usual CMOS fabrication. The circuit structure may include, for example, isolation trench 416, gate electrode 420 of MOS transistor, the interconnect 420, and the I/O pad 426. In addition, the protection stack layer can include the hard mask layer 422 and the top passivation layer 430. The protection stack layer in material of silicon nitride or any proper material, which can at least protect the surface of the substrate from being damaged during etching process, for example.

Figure 8I:
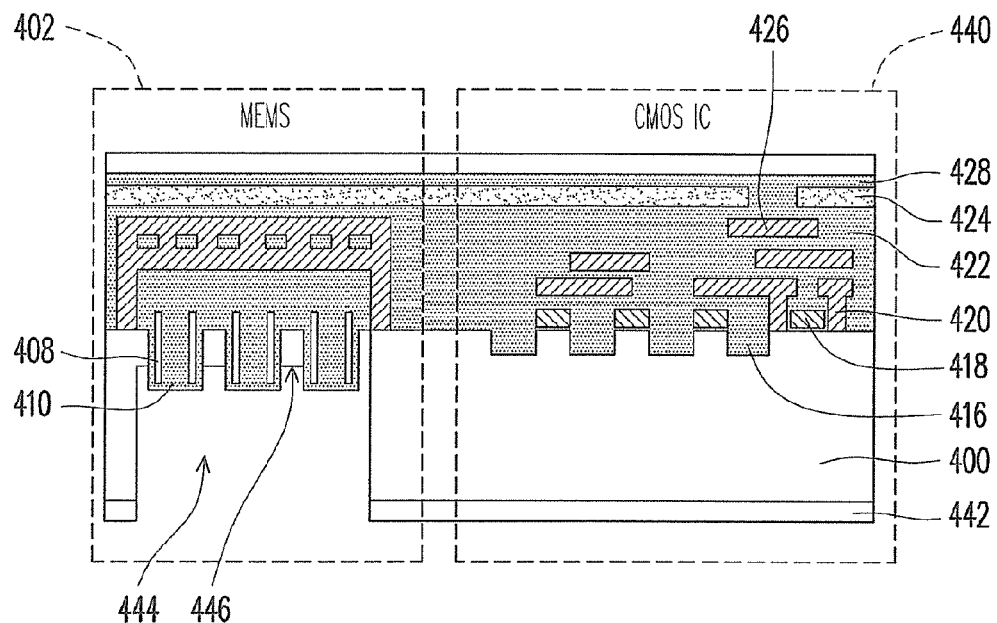
Figure 8J:
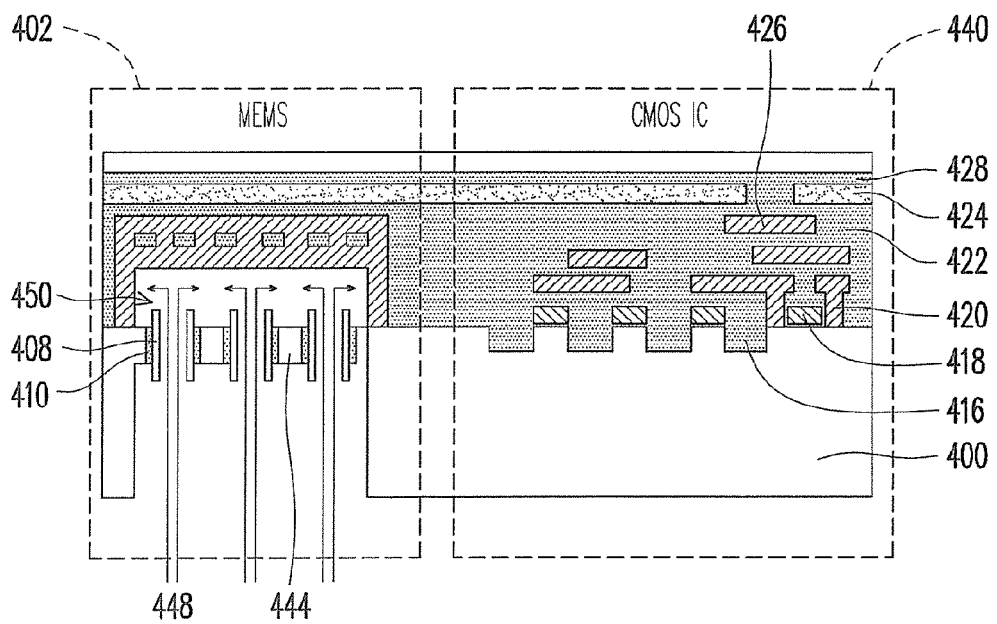

In FIG. 8I, a photoresist layer 442 used as an etching mask is formed on the substrate. The photoresist layer 442 has an opening at the MEMS region 402, corresponding to MEMS structure. In FIG. 8J, after the photoresist layer 442 is removed or remains, an isotropic etching process 448 is performed to etch dielectric portion. As a result, a chamber 450 is formed. The substrate portion 444 with the spacers 408 and 410 still remains. The MEMS structure is released at this stage. The chamber 450 is formed as well but not sealed as hermetic chamber yet. The isotropic etching process is vapor etching, for example. However, wet etching can also be used.

Figure 8K:
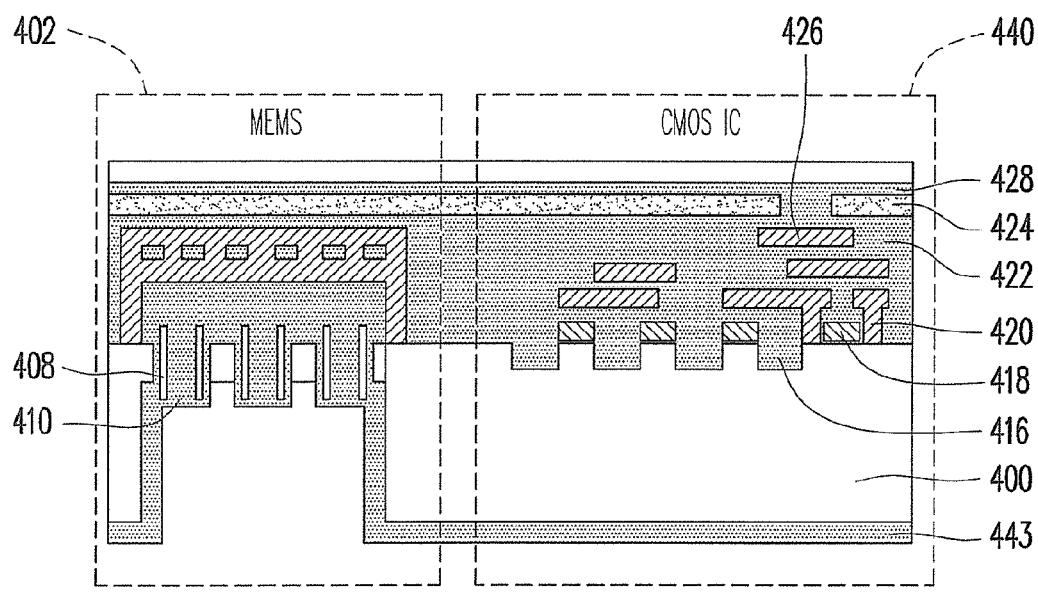

In FIG. 8K, when the wet etching process is taken, in order to have better etching efficiency, the sacrificial dielectric layer 443 can be formed over the substrate from the backside, so that the dielectric layer 443 is connected to the dielectric layer filled into the trenches. Then, the wet etching process can be performed. However, the dielectric layer 443 for the wet etching is not absolutely necessary.

Figure 9:
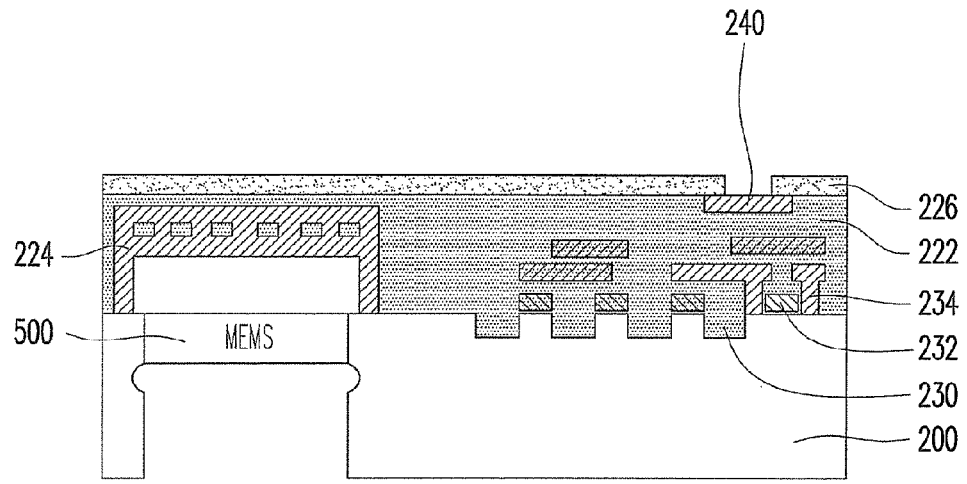
FIG. 9 is a cross-sectional view, schematically illustrating the process to form the hermetic chamber, according to one of embodiments of the invention.

After the MEMS structure is released and the chamber is formed, in which the front side has been sealed, another side of the chamber is to be sealed by packaging process. FIGS. 9-14 are cross-sectional views, schematically illustrating the process to form the hermetic chamber, according to embodiments of the invention. In FIG. 9, taking one structure in previous embodiments and the MEMS structure 500 represents any MEMS structure having been formed and released. The structural dielectric layer as previously described has embedded CMOS IC and the mechanical strength structure layer 224 at the MEMS region. However, the I/O pad can be exposed before sealing the chamber. The I/O pad 240 can be exposed by removing the protection layer and the dielectric layer but leave the hard mask layer 226 with an opening to expose the I/O pad 240.

Figure 10:
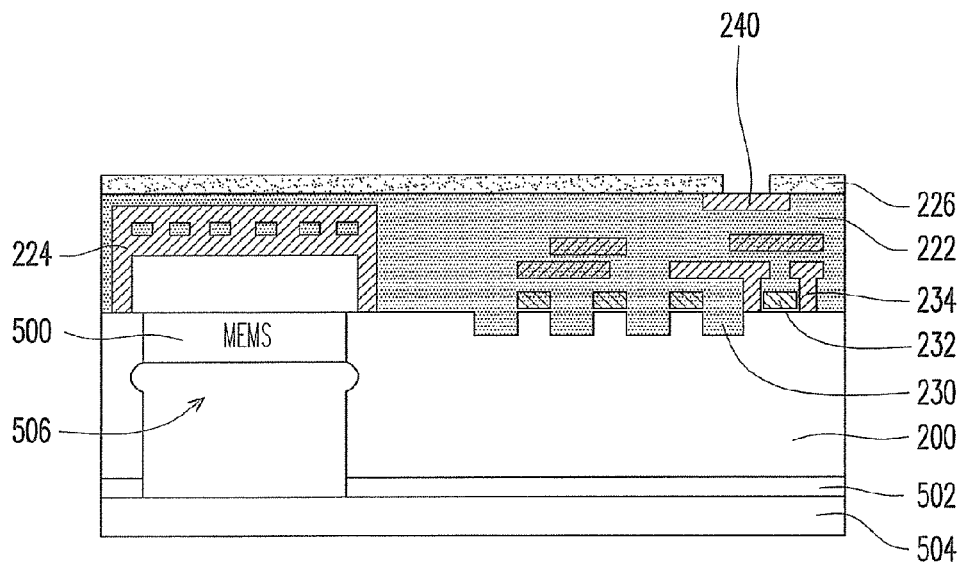
FIG. 10 is a cross-sectional view, schematically illustrating the process to form the hermetic chamber, according to one of embodiments of the invention.

In FIG. 10, a cover layer 504 is formed over the substrate 200 by, for example, adhesive layer 502, which completely encloses the periphery of the chamber. However, it is not the only choice. Any suitable packaging process can be use. After the cover layer 504 is formed over the substrate 200 from the other side, the chamber is sealed as a hermetic chamber 506.

Figure 11:
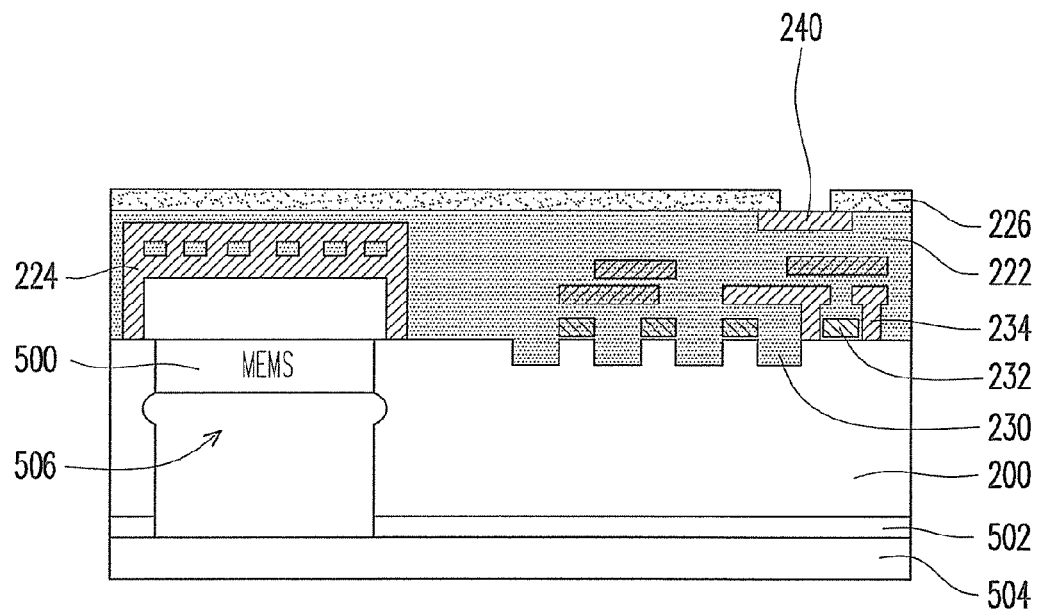
FIG. 11 is a cross-sectional view, schematically illustrating the process to form the hermetic chamber, according to one of embodiments of the invention.

In FIG. 11, alternatively, the I/O pad is open after the chamber is sealed into the hermetic chamber 506 by the cover layer 504 with the adhesive layer 502. In other words, the dielectric layer 242 still covers the I/O pad 240.

Figure 12:
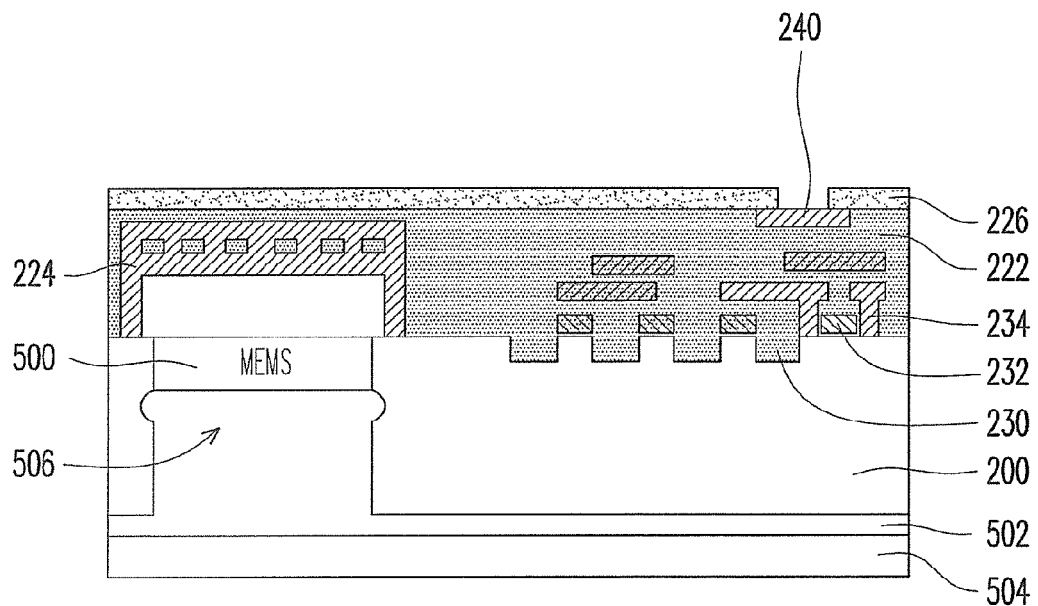
FIG. 12 is a cross-sectional view, schematically illustrating the process to form the hermetic chamber, according to one of embodiments of the invention.

In FIG. 12, based on the structure in FIG. 8J, the protection layer and the dielectric layer can be etched away to expose the I/O pad 240. Then, the chamber is sealed into the hermetic chamber 506 by the cover layer 504 with the adhesive layer 502.

Figure 13:
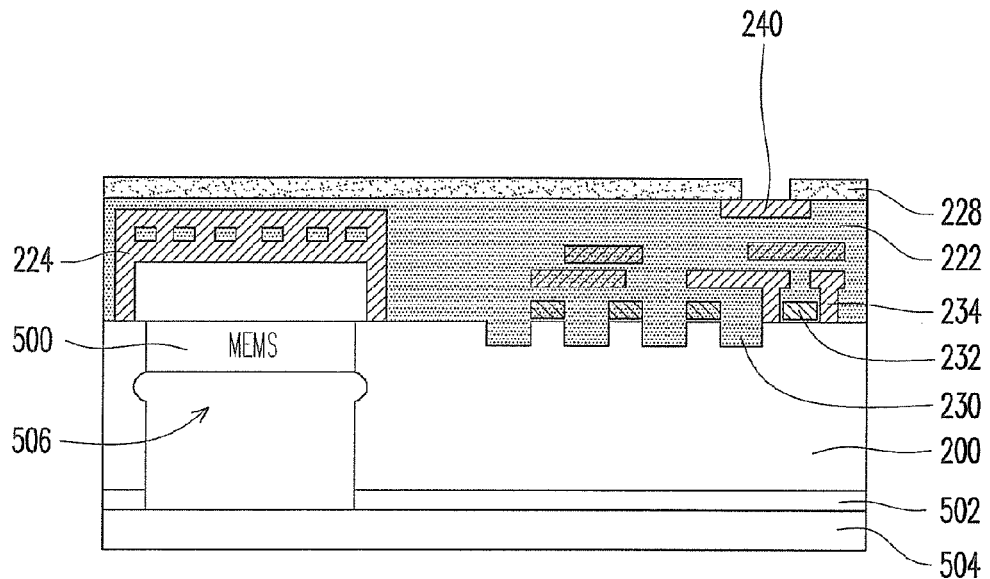
FIG. 13 is a cross-sectional view, schematically illustrating the process to form the hermetic chamber, according to one of embodiments of the invention.

In FIG. 13, for the structure based on FIG. 2J, the protection layer 228 and the dielectric layer 242 remain when packaging the cover layer 504 to the substrate 200 for the hermetic chamber 506.

Figure 14:
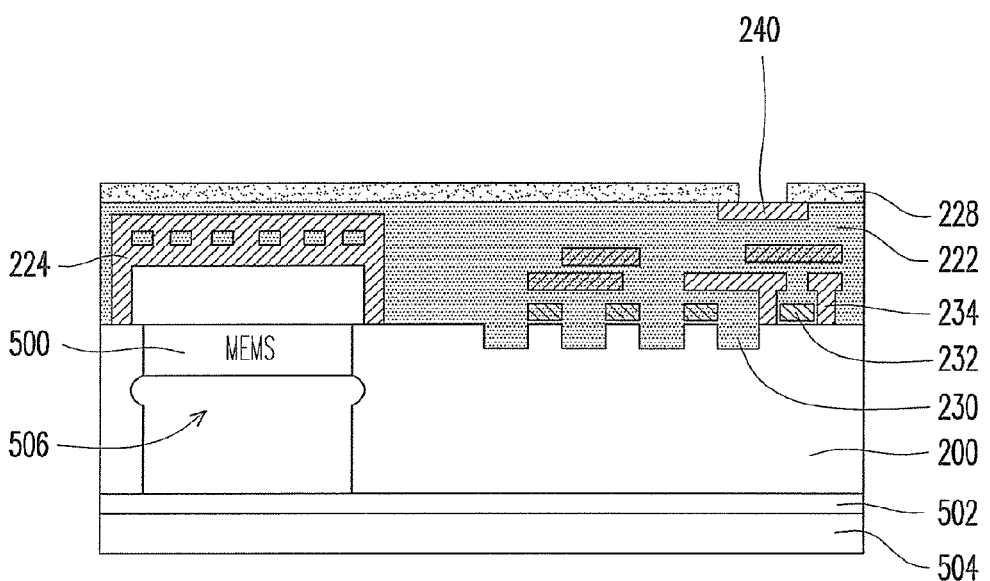
FIG. 14 is a cross-sectional view, schematically illustrating the process to form the hermetic chamber, according to one of embodiments of the invention.

In FIG. 14, alternatively, the dielectric layer 242 can be removed and the protection layer 228 with the opening to expose the I/O pad 240. Then, the cover layer 504 with the adhesive layer 502 to form the hermetic chamber 506.

In further applications, when the MEMS structure is used in the application of microphone, the fabrication processes can still be based on the same fabrication principle as previously described. FIGS. 17A-17D are cross-sectional views, schematically illustrating the fabrication process for MEMS device with SCS MEMS structure for the application of CMOS MEMS microphone, according to one of embodiments of the invention. The fabrication process can be also based on the structure shown in FIG. 17A. The structural dielectric layer 706 is formed on the substrate 690 having the MEMS region 700 and the CMOS circuit region 702. In the substrate, as previously described, the surface dielectric layer 705 is on the exposed surface of the silicon substrate 690 within the space 704. The dielectric layer 714 is formed over the substrate 690. Several elements, such as the MEMS diaphragm 708 for microphone, are embedded in the dielectric layer 714, which is then called structural dielectric layer 706. In the CMOS circuit region 702, the dielectric layer 714 are embedded with several device elements of CMOS IC, such as isolation trench 710, gate electrode 712, interconnect 716, etching stop layer 718, metal pad 718, . . . , and so on. In addition, another dielectric layer 722 can be also formed over the dielectric layer 714 as a part of the structural dielectric layer 706.

Figure 17A:
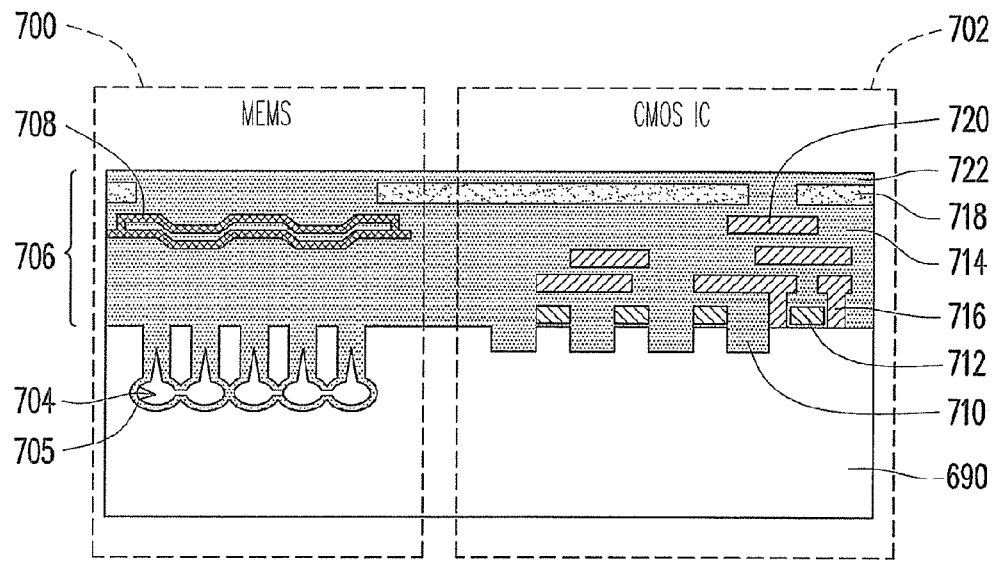
FIGS. 17A-17D are cross-sectional views, schematically illustrating the fabrication process for MEMS device with SCS MEMS structure for the application of CMOS MEMS microphone, according to one of embodiments of the invention.
Figure 17B:
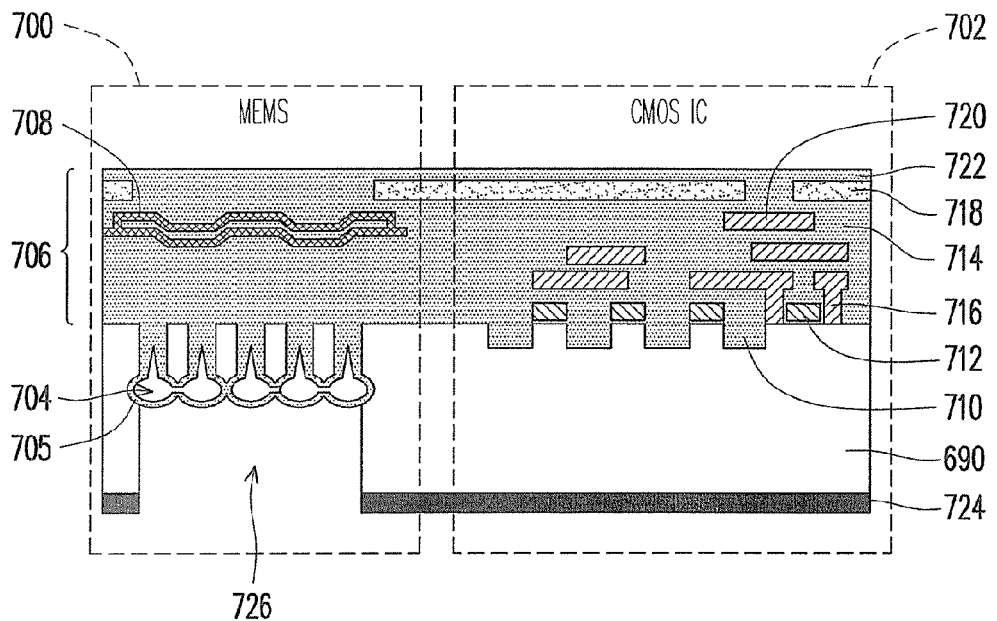
Figure 17C:
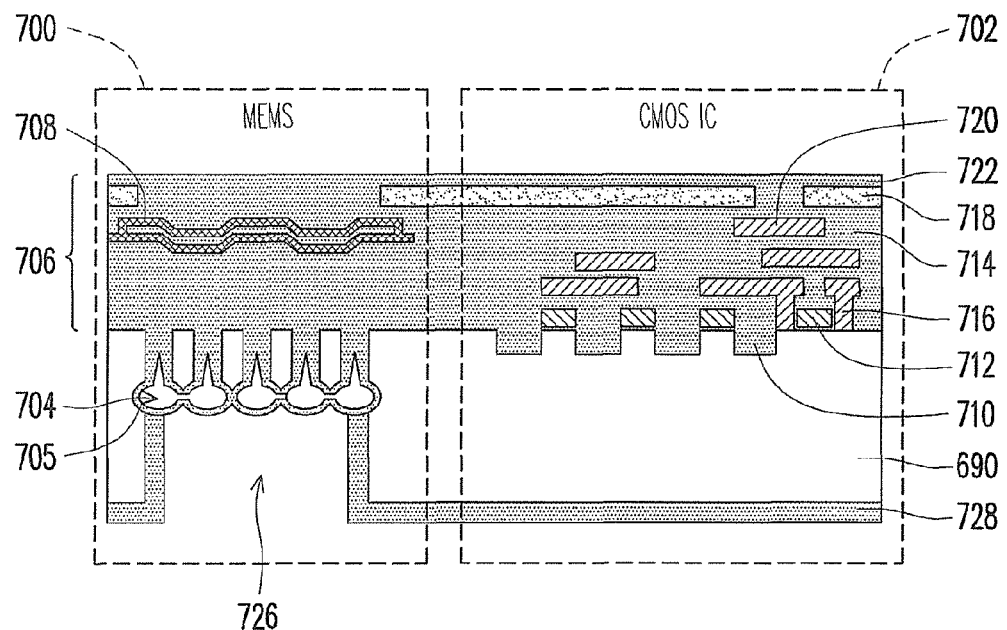

In FIG. 17B, an etching mask layer 724, such as photoresist layer, is formed on the backside of the substrate 690. The etching mask layer 724 has an opening to expose the substrate at the MEMS region 700. Then, an anisotropic etching process for the silicon material is performed from the backside of the substrate 690 to form an opening 726 to expose the surface dielectric layer 705. In FIG. 17C, the etching mask layer 724 is removed. A thin silicon oxide layer 728 is formed on the exposed surface of the substrate 690. However, instead, the silicon oxide layer can be directly deposited over the substrate 690. As previously described, this silicon oxide layer is helpful for the subsequent wet etching process with the wet etchant by, for example, buffered oxide etch (BOE) or dilute HF.

Figure 17D:
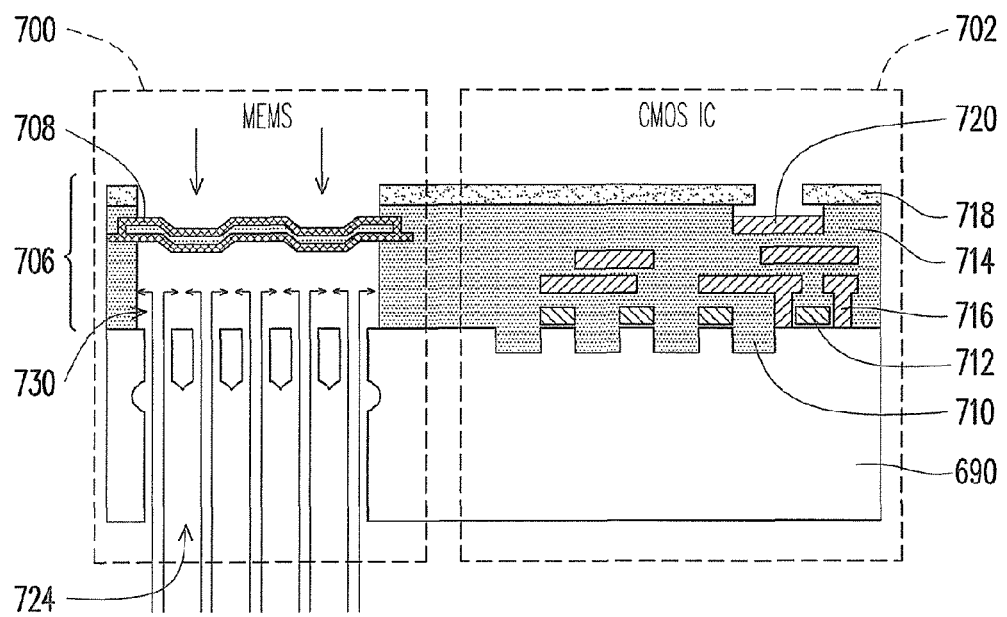

In FIG. 17D, with the silicon oxide layer 728, a wet etching process is performed from both sides of the substrate 690, as shown in arrows. As a result, the dielectric material is etched and the MEMS diaphragm 708 is exposed at the MEMS region 700. As a result, the space 724 in the substrate 690 and the space in the dielectric layer 714 are connected to form the chamber for the microphone. The dielectric layer 722 on top of the structural dielectric layer 706 is also removed but the etching stop layer 718 is exposed as well. The metal pad 720 is also exposed because the etching stop layer 718 has the opening corresponding to the metal pad 720, too.

In the above etching process, due to the help of the silicon oxide layer 728, the isotropic etching process, such as the wet etching process, with the etchant can more easily enter the space 730 through the narrow venting holes. The etching stop layer 718 is also in use as a protection layer during etching process.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating microelectromechanical system (MEMS) device, comprising:
    providing a substrate, having a first surface and a second surface;
    forming a MEMS structure over the first surface of the substrate,
    forming a structural dielectric layer over the first surface of the substrate, wherein the structural dielectric layer has a dielectric member and a space surrounding the MEMS structure is filled with the dielectric member;
    patterning the substrate by an etching process from the second surface of the substrate to expose a portion of the dielectric member filled in the spaces surrounding the MEMS structure;
    forming an wettable layer to cover an exposed portion of the substrate at the second surface; and
    performing at least an etching process on the dielectric member filled in the spaces surrounding the MEMS structure, wherein the MEMS structure is exposed and released, wherein the etching process comprises an isotropic etching process with an wet etchant, wherein at least a portion of the dielectric member in the spaces surrounding the MEMS structure is removed by the isotropic etching from the second side of the substrate.

2. The method for fabricating MEMS device in claim 1, wherein the wettable layer reacts with the wet etchant and is etched during the isotropic etching process.

3. The method for fabricating MEMS device in claim 1, wherein the wettable layer has a surface wetted by the wet etchant, and is not etched during the isotropic etching process.

4. The method for fabricating MEMS device in claim 1, wherein the wettable layer at least covers the exposed surface formed by the patterning process from the second side of the substrate.

5. The method for fabricating MEMS device in claim 1, wherein the MEMS structure comprises a diaphragm, wherein the dielectric member under the diaphragm is removed by the isotropic etching with the wet etchant.

* * * * *